(12) United States Patent
Park

(10) Patent No.: US 12,707,557 B2
(45) Date of Patent: Aug. 11, 2026

(54) DISPLAY DEVICE

(71) Applicant: Samsung Display Co., LTD., Yongin-si (KR)

(72) Inventor: Jaechun Park, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 705 days.

(21) Appl. No.: 18/072,794

(22) Filed: Dec. 1, 2022

(65) Prior Publication Data

US 2023/0225043 A1 Jul. 13, 2023

(30) Foreign Application Priority Data

Jan. 10, 2022 (KR) ........................ 10-2022-0003575

(51) Int. Cl.

| | |
|---|---|
| ***H05K 1/02*** | (2006.01) |
| ***G06F 3/041*** | (2006.01) |
| ***H05K 1/14*** | (2006.01) |
| ***H05K 7/20*** | (2006.01) |

(52) U.S. Cl.

CPC ........... *H05K 1/0215* (2013.01); *H05K 1/147* (2013.01); *H05K 7/20963* (2013.01); *G06F 3/0416* (2013.01); *H05K 2201/10128* (2013.01)

(58) Field of Classification Search

CPC .... G06F 3/0416; G06F 3/04165; G09F 9/301; G09G 3/035; H05K 1/0215; H05K 1/147; H05K 1/189; H05K 2201/10128

See application file for complete search history.

(56) References Cited

U.S. PATENT DOCUMENTS

2021/0259097 A1* 8/2021 Lee ........................ H05K 1/147
2021/0288282 A1* 9/2021 Kim ..................... H10K 59/131

FOREIGN PATENT DOCUMENTS

KR 10-2020-0034690 3/2020

* cited by examiner

*Primary Examiner* — Nathan Milakovich
(74) *Attorney, Agent, or Firm* — F. CHAU & ASSOCIATES, LLC

(57) ABSTRACT

A display device includes a display panel, a support member disposed under the display panel, a circuit board electrically connected to the display panel and disposed under the support member, and a metal sheet disposed between the circuit board and the support member, bonded to the circuit board by a first adhesive film, and bonded to the support member by a second adhesive film.

8 Claims, 35 Drawing Sheets

WM
200
100
320
310
300
D3
D1
D2
P1
P2
P3
DIC
10
TIC
410
430
420
610
500
620
400

WM
200
100
320
310
300
700
D3
D1
D2
P1
P2
DIC
P3
20
TIC
410
430
420
400

WM
200
100
320
310
300
700
D1
D2
D3
P1
P2
P3
DIC
30
TIC
410
430
420
400
610
800
620

DM:100,200,300,400,500,900
WM:TA,BA
100:DA,NDA

40
WM
200
100
320
310
300
D3
D1
D2
900
DIC
TIC
400
410
430
420
610
500
620

TA
DA
OP
NDA
BA
WM
200
100
320
310
300
620
500
610
420
430
410
400
444
442
440
TIC
900
I
I'
40

DM:100,200,300,400,700,900
WM:TA,BA
100:DA,NDA

DM:100,200,300,400,700,800,900
WM:TA,BA
100:DA,NDA

DISPLAY DEVICE

CROSS-REFERENCE TO RELATED APPLICATION(S)

This application claims priority to and the benefit of Korean Patent Application No. 10-2022-0003575 under 35 U.S.C. § 119, filed on Jan. 10, 2022 in the Korean Intellectual Property Office (KIPO), the entire contents of which are incorporated herein by reference.

BACKGROUND

1. Technical Field

Embodiments of the disclosure relate to a display device. More specifically, embodiments of the disclosure relate to a display device with improved resistance characteristic and heat dissipation characteristic.

2. Description of the Related Art

A display device includes a display panel, a circuit board, and a driving chip. A signal generated by the circuit board may be transmitted to the display panel through the driving chip.

Recently, a flexible display device that can be bent or folded has been developed. The flexible display device includes a flexible display panel, a flexible circuit film electrically connected to the display panel, and various functional members.

SUMMARY

Embodiments provide a display device with improved resistance characteristic and heat dissipation characteristic.

However, embodiments of the disclosure are not limited to those set forth herein. The above and other embodiments will become more apparent to one of ordinary skill in the art to which the disclosure pertains by referencing the detailed description of the disclosure given below.

A display device according to an embodiment may include a display panel, a support member disposed under the display panel, a circuit board electrically connected to the display panel and disposed under the support member, and a metal sheet disposed between the circuit board and the support member, bonded to the circuit board by a first adhesive film, and bonded to the support member by a second adhesive film.

In an embodiment, the circuit board may include a ground wire electrically connected to the metal sheet, and a cover layer disposed between the metal sheet and the ground wire and including an opening which exposes a portion of the ground wire. The metal sheet may be bonded to the cover layer by the first adhesive film.

In an embodiment, the circuit board may further include a step compensation film. The step compensation film may be disposed to correspond to the opening and may electrically connect the metal sheet and the portion of the ground wire exposed by the opening.

In an embodiment, the step compensation film may include a conductive film, and a conductive tape disposed between the conductive film and the metal sheet.

In an embodiment, each of the first adhesive film and the second adhesive film may be a double-sided adhesive film.

In an embodiment, each of the first adhesive film and the second adhesive film may be an anisotropic conductive adhesive film.

In an embodiment, the display device may further include a panel driving chip overlapping the support member. The display panel may include a first area which emits light, a second area extending from the first area and bent with a curvature, and a third area extending from the second area and overlapping the support member. The panel driving chip may be mounted on the third area of the display panel.

In an embodiment, the display device may further include a flexible circuit film electrically connecting the display panel and the circuit board and overlapping the support member, and a panel driving chip mounted on the flexible circuit film and overlapping the support member.

A display device according to another embodiment may include a display panel, a support member disposed under the display panel, a circuit board electrically connected to the display panel and disposed under the support member, a heat dissipation layer disposed between the circuit board and the support member, including a first opening which exposes the support member, and including graphite, and a first metal sheet disposed to correspond to the first opening.

In an embodiment, the circuit board may include a ground wire electrically connected to the first metal sheet and a cover layer disposed on the ground wire and including a second opening which exposes a portion of the ground wire. The first metal sheet may overlap the second opening.

In an embodiment, the circuit board may further include a step compensation film. The step compensation film may be disposed to correspond to the second opening and may electrically connect the first metal sheet and the portion of the ground wire exposed by the second opening.

In an embodiment, the step compensation film may include a conductive film and a conductive tape disposed between the conductive film and the first metal sheet.

In an embodiment, the display device may further include a touch sensing part disposed on the display panel, and a touch driving chip mounted on the circuit board and overlapping the support member.

In an embodiment, the touch driving chip may overlap the first metal sheet.

In an embodiment, the display device may further include a panel driving chip overlapping the support member. The display panel may include a first area which emits light, a second area extending from the first area and bent with a curvature, and a third area extending from the second area and overlapping the support member. The panel driving chip may be mounted on the third area of the display panel.

In an embodiment, the panel driving chip may overlap the first metal sheet.

In an embodiment, the display device may further include a flexible circuit film electrically connecting the display panel and the circuit board and overlapping the support member, and a panel driving chip mounted on the flexible circuit film and overlapping the support member.

In an embodiment, the panel driving chip may overlap the first metal sheet.

In an embodiment, the display device may further include a second metal sheet disposed between the circuit board and the heat dissipation layer, bonded to the circuit board by a first adhesive film, and bonded to the heat dissipation layer by a second adhesive film.

In an embodiment, each of the first adhesive film and the second adhesive film may be an anisotropic conductive adhesive film.

Therefore, the display device according to embodiments may include the metal sheet and a heat dissipation layer disposed between the support member and the circuit board. Accordingly, by simplifying the stack structure under the display panel and keeping a stack thickness thin, a change in resistance may be minimized and a low resistance may be stably maintained. Heat dissipation characteristic of the display device may be improved.

It is to be understood that both the foregoing general description and the following detailed description are exemplary and explanatory and are intended to provide further explanation of the disclosure as claimed.

BRIEF DESCRIPTION OF THE DRAWINGS

Illustrative, non-limiting embodiments will be more clearly understood from the following detailed description taken in conjunction with the accompanying drawings.

FIG. 6 is a schematic cross-sectional view taken along line II-II' of FIG. 4.

FIG. 7 is a schematic enlarged cross-sectional view of 'AA' of FIG. 6.

FIG. 9 is a schematic cross-sectional view illustrating the display device of FIG. 8.

FIG. 11 is a schematic cross-sectional view taken along line I-I' of FIG. 10.

FIG. 17 is a schematic cross-sectional view taken along line I-I' of FIG. 16.

FIG. 18 is a schematic cross-sectional view taken along line II-II' of FIG. 16.

FIG. 19 is a schematic enlarged cross-sectional view of 'CC' of FIG. 18.

FIG. 29 is a schematic cross-sectional view taken along line I-I' of FIG. 28.

FIG. 30 is a schematic cross-sectional view taken along line II-II' of FIG. 28.

FIG. 34 is a schematic cross-sectional view taken along line I-I' of FIG. 33.

FIG. 35 is a schematic cross-sectional view taken along line II-II' of FIG. 33.

DETAILED DESCRIPTION OF THE EMBODIMENTS

Figure 1:
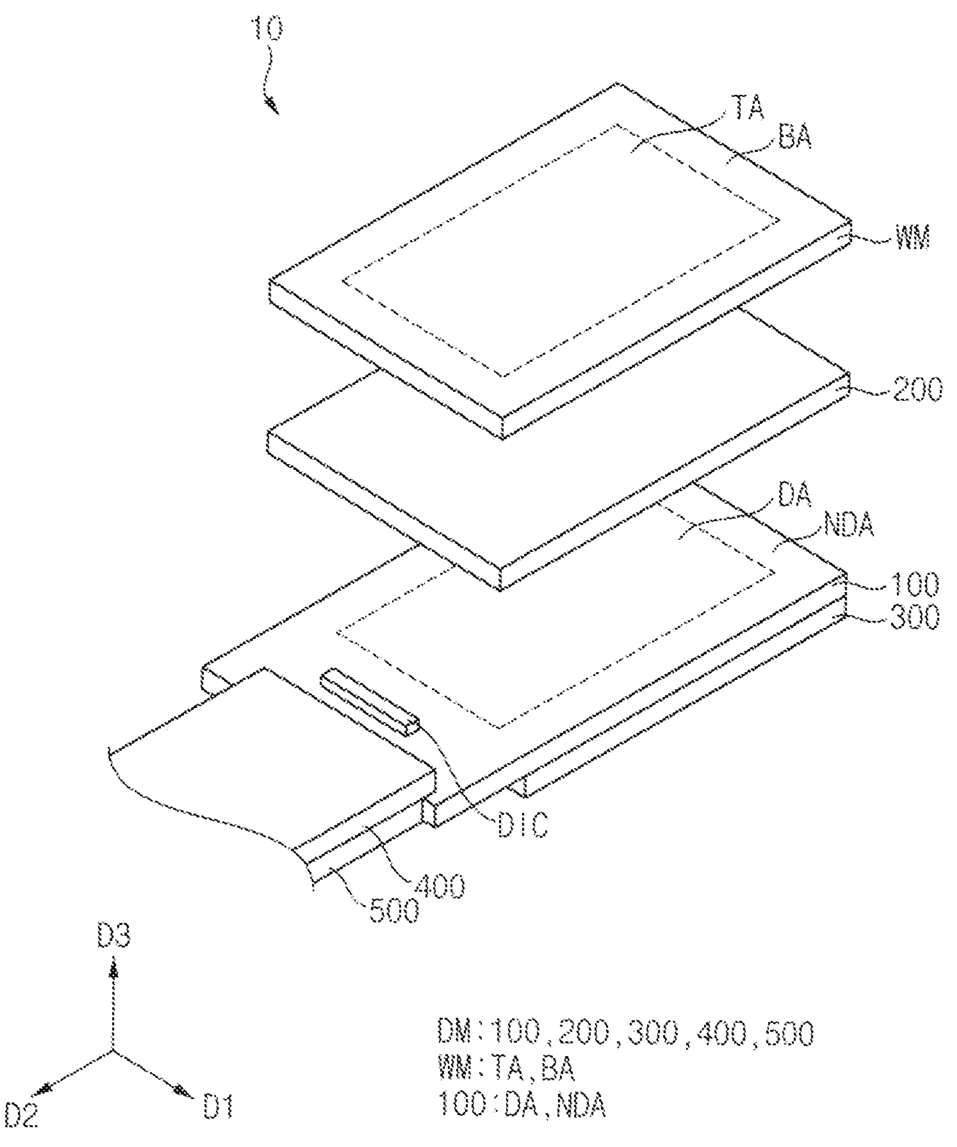
FIG. 1 is a schematic exploded perspective view illustrating a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing exemplary features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

The term "overlap" or "at least partially overlap" as used herein may mean that at least part of a first object faces at least part of a second object in a given direction or given view.

The phrase "at least one of" is intended to include the meaning of "at least one selected from the group of" for the purpose of its meaning and interpretation. For example, "at least one of A and B" may be understood to mean "A, B, or A and B.".

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Illustrative, non-limiting embodiments will be more clearly understood from the following detailed description in conjunction with the accompanying drawings.

Figure 2:
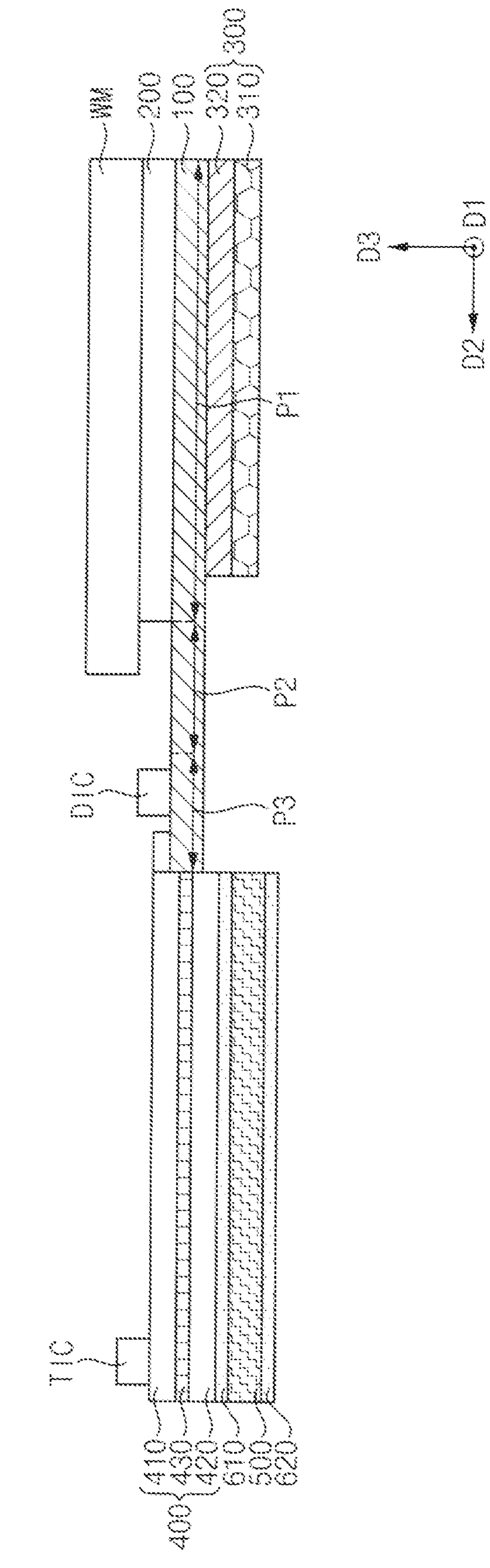
FIG. 2 and FIG. 3 are schematic cross-sectional views illustrating the display device of FIG. 1.
Figure 3:
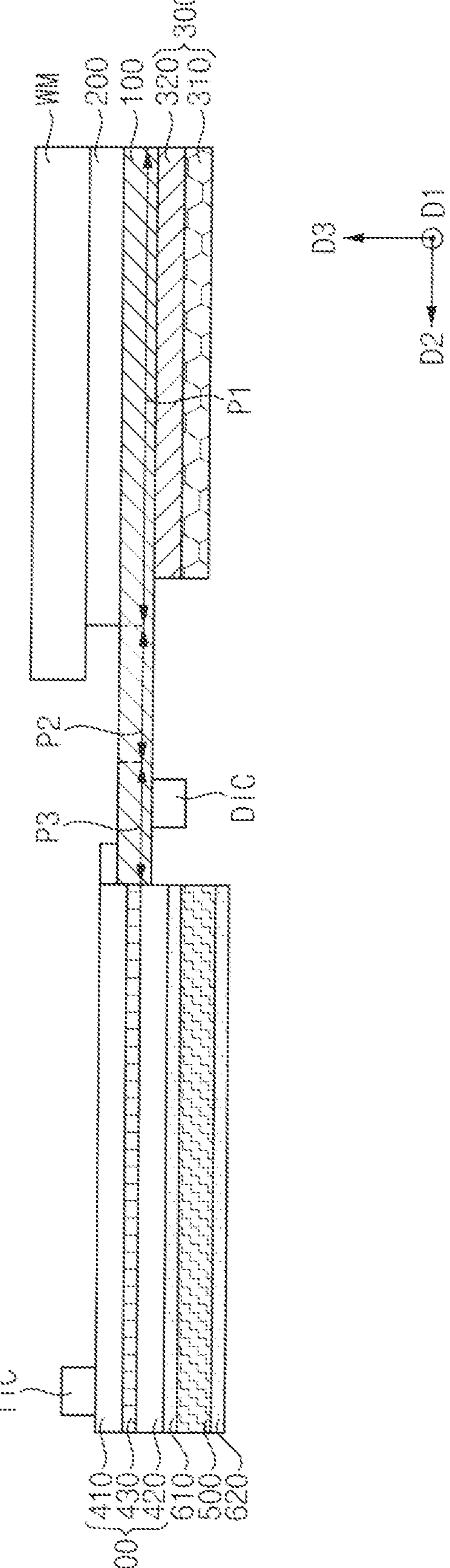
Figure 4:
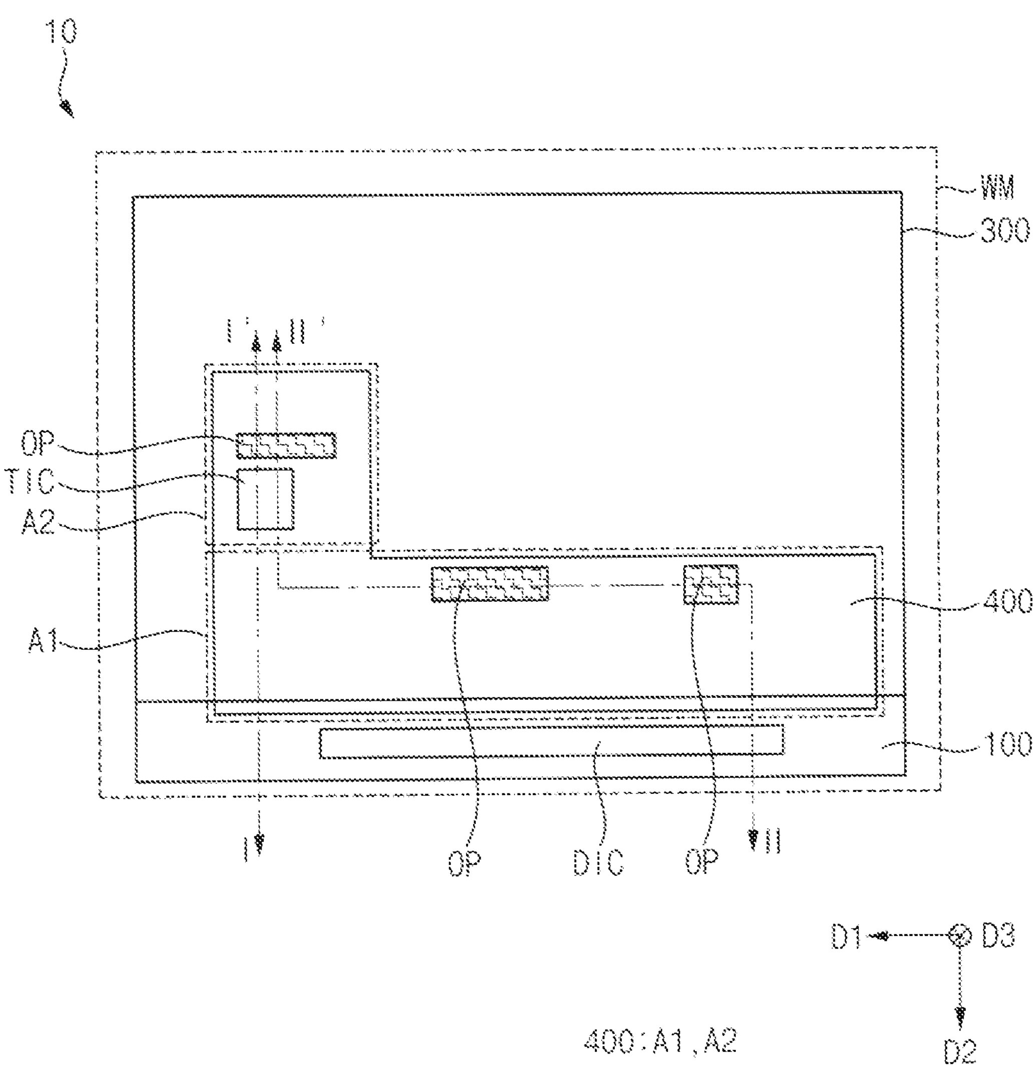
FIG. 4 is a schematic rear view illustrating the display device of FIG. 1.
Figure 5:
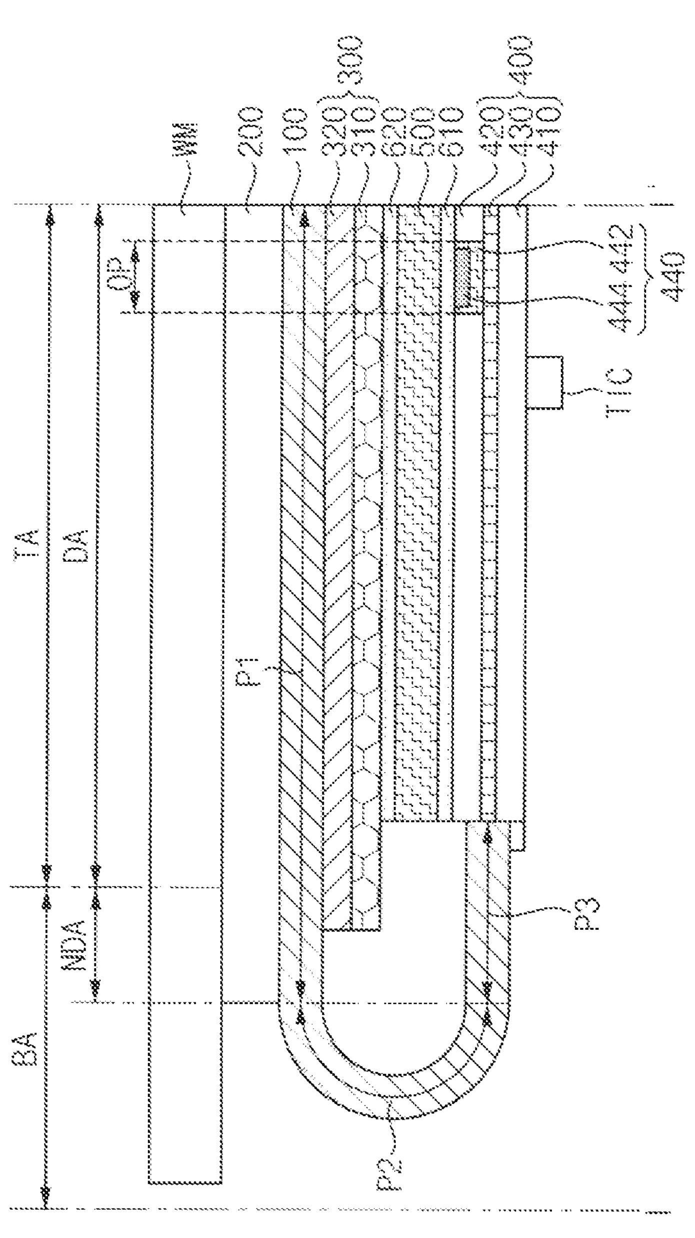
FIG. 5 is a schematic cross-sectional view taken along line I-I' of FIG. 4.
Figure 6:
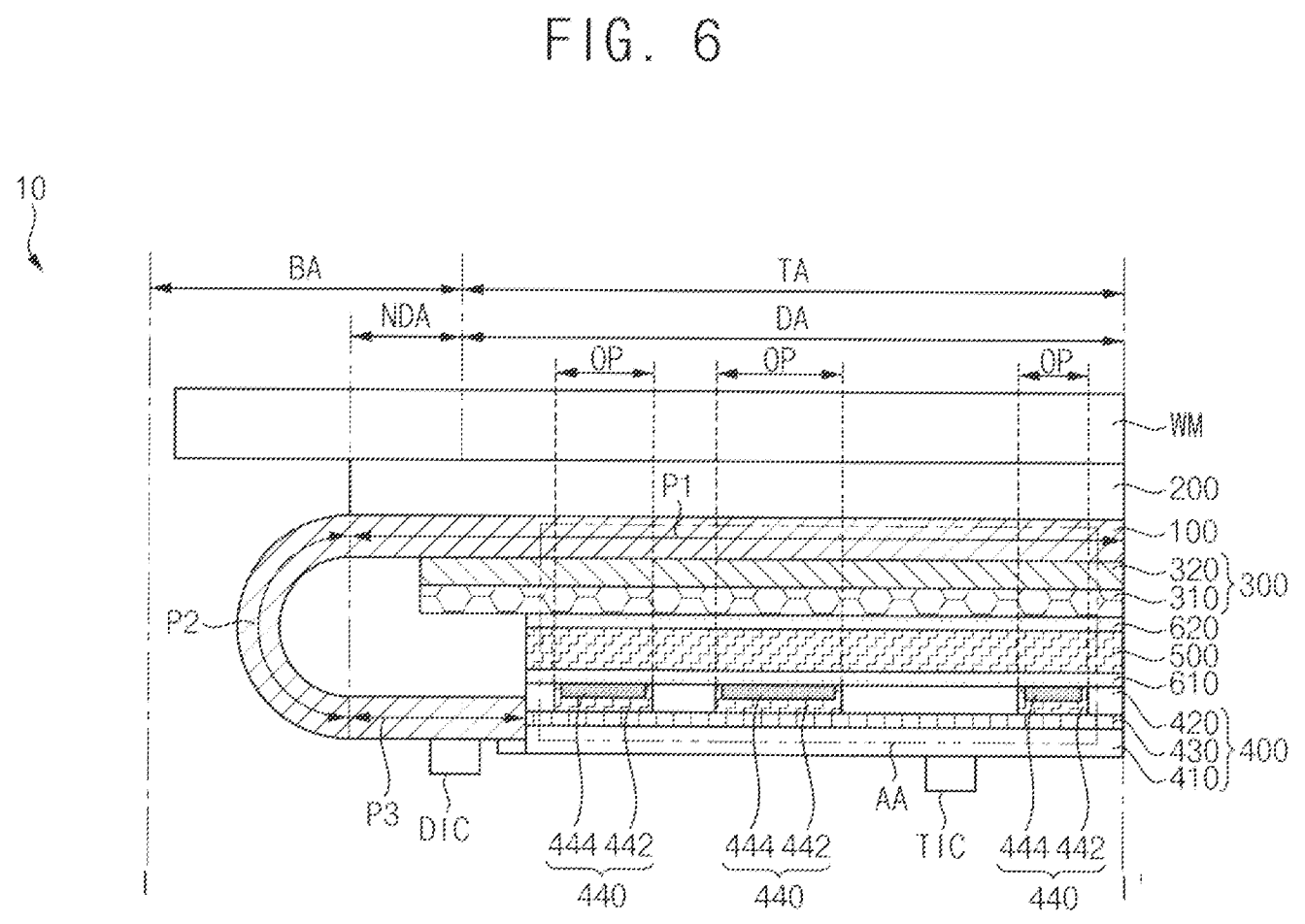
Figure 7:
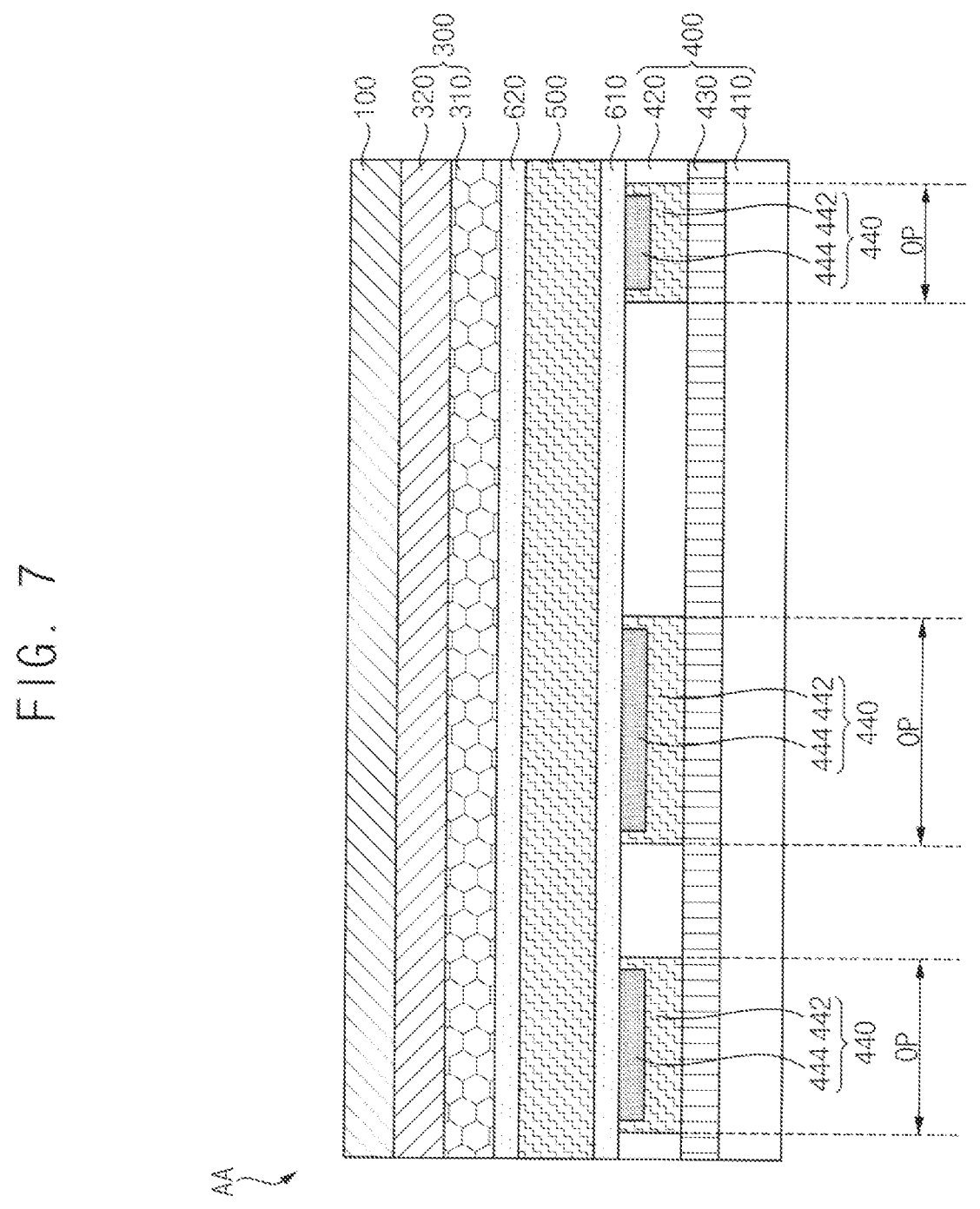

FIG. 1 is a schematic exploded perspective view illustrating a display device according to an embodiment. FIG. 2 and FIG. 3 are schematic cross-sectional views illustrating the display device of FIG. 1. FIG. 4 is a schematic rear view illustrating the display device of FIG. 1. FIG. 5 is a schematic cross-sectional view taken along line I-I' of FIG. 4. FIG. 6 is a schematic cross-sectional view taken along line II-II' of FIG. 4. FIG. 7 is a schematic enlarged cross-sectional view of 'AA' of FIG. 6.

Referring to FIGS. 1 to 7, a display device 10 may display an image from a display surface parallel to each of a first direction D1 and a second direction D2 toward a third direction D3. The display surface on which the image is displayed may correspond to a front surface of the display device 10. For example, the second direction D2 may be defined as a direction perpendicular to the first direction D1, and the third direction D3 may be defined as a direction perpendicular to each of the first direction D1 and the second direction D2.

In embodiments of the disclosure, a front surface (or an upper surface) and a rear surface (or a lower surface) of each member may be defined based on a direction in which the image is displayed. The front surface and the rear surface may be opposite to each other based on the third direction D3, and each of normal directions of the front surface and the rear surface may be parallel to the third direction D3.

The display device 10 may include a window member WM and a display module DM.

In an embodiment, the window member WM may be disposed on the display module DM. The window member WM may protect the display module DM from external impacts and scratches. The window member WM may include a transparent material capable of emitting the image. For example, the window member WM may include a material such as glass, sapphire, plastic, or the like. In an embodiment, the window member WM may have a single layer. However, the disclosure is not limited thereto, and the window member WM may have multiple layers.

The window member WM may include a transmission area TA and a light blocking area BA. The transmission area TA may be an area through which light passes, and the image provided from the display module DM may be provided to the user by passing through the transmission area TA. The light blocking area BA may be an area which blocks light transmission. In an embodiment, the light blocking area BA may be located around the transmission area TA and may surround the transmission area TA.

The display module DM may include a display panel 100, a touch sensing part 200, a support member 300, a panel driving chip DIC, a circuit board 400, and a metal sheet 500.

A planar shape of the display panel 100 may have a rectangular shape. In an embodiment, an edge where a long side and a short side of the display panel 100 are contacted may have a right angle. However, the disclosure is not limited thereto, and the edge may have a round shape. The planar shape of the display panel 100 may be a circular shape or other shapes.

The display panel 100 may include a display area DA and a non-display area NDA. The display area DA may be an area in which the image is displayed, and the non-display area NDA may be an area in which the image is not displayed. The non-display area NDA may be located around the display area DA and may surround the display area DA. In an embodiment, the display area DA of the display panel 100 may correspond to at least a portion of the transmission area TA, and the non-display area NDA of the display panel 100 may correspond to at least a portion of the light blocking area BA. For example, the light blocking area BA may cover the non-display area NDA of the display panel 100.

The display panel 100 may include various display panels such as an organic light emitting display panel, a quantum dot light emitting display panel, a liquid crystal display panel, a plasma display panel, an electrophoretic display panel, an electro wetting display panel, or the like.

The touch sensing part 200 may be disposed on the display panel 100. The touch sensing part 200 may detect a position of a touch input from outside. In an embodiment, the touch sensing unit 200 may acquire a coordinate of the position of the touch input by using a capacitance method. The capacitance method may acquire the coordinate of the position of the touch input by using a self-capacitance method or a mutual capacitance method.

In an embodiment, the touch sensing part 200 may be integrally formed with the display panel 100. For example, touch electrodes of the touch sensing part 200 may be disposed directly on an encapsulation layer of the display panel 100. In another embodiment, the touch sensing part 200 may be formed as a separate configuration from the display panel 100 and may be bonded to the display panel 100 through a separate adhesive layer or the like.

In an embodiment, the touch sensing part 200 and the circuit board 400 may be electrically connected to each other. In another embodiment, the touch sensing part 200 may be electrically connected to a separate circuit board (e.g., separate flexible circuit board). For example, the display module DM may further include the separate flexible circuit board for electrically connecting the touch sensing part 200 and the circuit board 400.

In an embodiment, a touch driving chip TIC may be mounted on the circuit board 400. The touch driving chip TIC may control an operation of the touch sensing part 200. The touch driving chip TIC may detect a touch information (a touch pressure, a touch position, etc.) by providing a driving signal to the touch sensing part 200 and receiving a sensing signal generated by the touch sensing part 200.

The support member 300 may be disposed under the display panel 100. In an embodiment, the support member 300 may include a base layer 310 and a cushion layer 320.

The base layer 310 may include various materials which have excellent rigidity and capable of shielding electromagnetic waves. Examples of the materials that may be included in the base layer 310 may include iron, nickel, copper, tin, gold, stainless steel, or the like. Examples of the materials that may be used as the stainless steel may include SUS 304, SUS 316, SUS 321, SUS 409, SUS 430, or the like. The materials may be used alone or in combination with each other.

In an embodiment, the cushion layer 320 may have a porous structure with elasticity. The cushion layer 320 may include a synthetic resin. The cushion layer 320 may have a form of foam. Examples of materials that may be included in the cushion layer 320 may include acrylonitrile butadiene styrene copolymer (ABS), polyurethane (PU), polyethylene (PE), ethylene vinyl acetate (EVA), polyvinyl chloride (PVC), or the like. The materials may be used alone or in combination with each other. The cushion layer 320 may improve impact resistance of the support member 300.

The panel driving chip DIC may be disposed on the non-display area NDA of the display panel 100. The panel driving chip DIC may generate a driving signal for driving the display panel 100, and the driving signal generated by the panel driving chip DIC may be provided to the display panel 100. The panel driving chip DIC may include a driving element (e.g., a data driving circuit) for driving pixels of the display panel 100.

In an embodiment, the panel driving chip DIC may be mounted on (or under) the non-display area NDA of the display panel 100. For example, in case that a base substrate of the display panel 100 is made of glass, the panel driving chip DIC may be mounted on the base substrate in the form of a chip on glass (COG). In case that the base substrate is made of plastic, the panel driving chip DIC may be mounted on the base substrate in the form of a chip on plastic (COP). However, the disclosure is not limited thereto, and the panel driving chip DIC may be mounted on a flexible circuit film (referring to a flexible circuit film 900 of FIG. 20). Hereinafter, a case in which the panel driving chip DIC is mounted on (or under) the non-display area NDA of the display panel 100 will be described as an example. An example in which the panel driving chip DIC is mounted on the flexible circuit film will be described below with reference to FIGS. 20 to 35.

The panel driving chip DIC may be mounted on a third area P3 (described below) of the display panel 100. In an embodiment, as shown in FIG. 2, the panel driving chip DIC may be mounted on an upper surface of the display panel 100. In another embodiment, as shown in FIG. 3, the panel driving chip DIC may be mounted on a lower surface of the display panel 100. Hereinafter, a case in which the panel driving chip DIC is mounted on the upper surface of the display panel 100 will be described as an example.

The circuit board 400 may be connected to the display panel 100. In an embodiment, the circuit board 400 may be electrically connected to the display panel 100. A signal for controlling the panel driving chip DIC may be applied to the circuit board 400. The circuit board 400 may be bonded to the non-display area NDA of the display panel 100.

In an embodiment, the circuit board 400 may have an 'L'-shaped planar shape, e.g., in a rear view. For example, the circuit board 400 may include a body part A1 and a protrusion part A2. The body part A1 may extend in the first direction D1 and may be bonded to the display panel 100 (e.g., directly bonded to the non-display area NDA). The protrusion part A2 may be formed to protrude from a side of the body part A1 by a length (e.g., a predetermined or selectable length). However, the disclosure is not limited thereto, and the shape of the circuit board 400 may be various.

In an embodiment, a portion of the display panel 100 may be bent. The display panel 100 may include a first area P1 which emits light and is not bent, and a second area P2 and a third area P3 which are bent. For example, a bent portion of the display panel 100 may include the second area P2 and the third area P3. The second area P2 may extend from the first area P1 and may be bent with a curvature (e.g., a predetermined or selectable curvature). The third area P3 may extend from the second area P2 and may face the first area P1 at a bent state. As the display panel 100 is bent, the third area P3 may overlap the support member 300, e.g., in the third direction D3 or in a rear view.

As the display panel 100 unfolded as shown in FIG. 2 is bent as shown in FIGS. 4 and 6, the panel driving chip DIC may be disposed under the display panel 100. For example, the panel driving chip DIC may overlap the support member 300. The circuit board 400 electrically connected to the display panel 100 may be disposed on a rear surface of the display panel 100. The metal sheet 500 bonded to the circuit board 400 may be bonded to the support member 300.

For example, as the display panel 100 is bent, the circuit board 400 may include a rear surface facing the support member 300, and an upper surface of the circuit board 400 may be defined as a surface opposite to the rear surface. In an embodiment, circuit components may be mounted on the upper surface of the circuit board 400. Examples of the circuit components may include a control chip, multiple passive devices, multiple active devices, or the like.

In an embodiment, the circuit board 400 may have a structure in which multiple layers are stacked. For example, the circuit board 400 may include a first cover layer 410, a second cover layer 420, and a ground wire 430.

The first cover layer 410 and the second cover layer 420 may include an insulating material. The upper surface of the circuit board 400 may be defined as a first surface of the first cover layer 410. The circuit board 400 may further include multiple cover layers as well as the first cover layer 410 and the second cover layer 420. For example, the upper surface of the circuit board 400 may be defined as an upper surface of a cover layer disposed at the outermost of the multiple cover layers.

The ground wire 430 may be disposed on a second surface of the first cover layer 410. The second surface of the first cover layer 410 may be a surface opposite to the first surface of the first cover layer 410. The ground wire 430 may be a metal wire and may receive a ground voltage. The ground wire 430 may be covered by the second cover layer 420. The second cover layer 420 may include an opening OP which exposes a portion of the ground wire 430.

In an embodiment, as shown in FIGS. 3 and 4, the second cover layer 420 may include two openings OP formed in the body part A1 of the circuit board 400 and may include an opening OP formed in the protrusion part A2 of the circuit board 400. For example, the two openings OP formed in the body part A1 of the circuit board 400 may not overlap the protrusion part A2 of the circuit board 400 in a rear view, and may be disposed to be closest to a side from which the protrusion part A2 of the circuit board 400 protrudes among sides of the body part A1 of the circuit board 400. The two openings OP formed in the body part A1 of the circuit board 400 may be disposed to be spaced apart from each other at a distance (e.g., a predetermined or selectable distance). Accordingly, the openings OP may be formed to be distributed over various areas without being biased on a partial area of the circuit board 400. The openings OP may be formed to have a wider width. Accordingly, the resistance characteristic of the display device 10 may be further improved. For example, the change in resistance may be further minimized, and the low resistance may be more stably maintained.

However, the disclosure is not limited thereto. For example, positions where the openings OP are formed, a width of the openings OP, and a number of openings OP may vary depending on a shape of the circuit board 400, an area of the circuit board 400, and a location where the ground wire 430 is disposed on the circuit board 400, and the like.

In an embodiment, the metal sheet 500 may be bonded to the circuit board 400. For example, the metal sheet 500 may be bonded to the second cover layer 420 of the circuit board 400. For example, the second cover layer 420 may be disposed between the metal sheet 500 and the ground wire 430. The metal sheet 500 may include materials which have conductivity. Examples of the materials that may be included in the metal sheet 500 may include copper, gold, silver, aluminum, or the like. The materials may be used alone or in combination with each other.

In an embodiment, the circuit board 400 may further include a step compensation film 440. The step compensation film 440 may be disposed to correspond to the opening OP and may be electrically connected to the portion of the ground wire 430 exposed by the opening OP. The step compensation film 440 may compensate for a step difference of the second cover layer 420 due to the opening OP. The step compensation film 440 may include a conductive film 442 and a conductive tape 444.

The conductive film 442 may be a base film of the step compensation film 440. The conductive film 442 may have a thickness sufficient to compensate for the step difference with the second cover layer 420. The conductive film 442 may include materials which have conductivity. In an embodiment, the conductive film 442 may include the same materials as the metal sheet 500. Examples of materials that may be included in the conductive film 442 may include copper, gold, silver, aluminum, or the like. The materials may be used alone or in combination with each other.

The conductive tape 444 may be disposed between the conductive film 442 and the metal sheet 500. The conductive tape 444 may bond the metal sheet 500 to the circuit board 400. The metal sheet 500 may be electrically connected to the conductive film 442 and the ground wire 430 by the conductive tape 444.

In an embodiment, each of a first adhesive film 610 and a second adhesive film 620 may be additionally disposed on both surfaces of the metal sheet 500, respectively. For example, each of the first adhesive film 610 and the second adhesive film 620 may be a double-sided adhesive film. Accordingly, the first adhesive film 610 may more firmly bond the metal sheet 500 to the second cover layer 420. As the display panel 100 is bent (see, e.g., FIGS. 5 and 6), the circuit board 400 may be disposed on a rear surface of the support member 300, and the metal sheet 500 may be bonded to the support member 300 by the second adhesive film 620.

In an embodiment, each of the first adhesive film 610 and the second adhesive films 620 may be an anisotropic conductive adhesive film. Accordingly, some wires (e.g., the ground wire 430) of the circuit board 400 may be electrically connected to the metal sheet 500 by the step compensation film 440 and the first adhesive film 610 therebetween. The metal sheet 500 may be electrically connected to the support member 300 (e.g., the base layer 310) by the second adhesive film 620. For example, the circuit board 400 (e.g., the ground wire 430 of the circuit board 400) may be electrically connected to the support member 300 by the step compensation film 440, the first adhesive film 610, the second adhesive film 620, and the metal sheet 500.

According to embodiments, since the display device 10 includes the metal sheet 500 disposed between the circuit board 400 and the support member 300, the resistance characteristic of the display device 10 may be improved. Since the metal sheet 500 is electrically connected (e.g., directly electrically connected) to the wire of the circuit board 400 and the support member 300, a separate conductive layer (e.g., conductive fiber) disposed between the circuit board 400 and the support member 300 may not be required. Accordingly, a stacked structure under the display panel 100 may be simplified and a stacked thickness may be kept thin. Accordingly, the change in resistance may be minimized, and the low resistance may be stably maintained. The heat dissipation characteristic of the display device 10 may be further improved because of the excellent heat dissipation property of the metal sheet 500.

Figure 8:
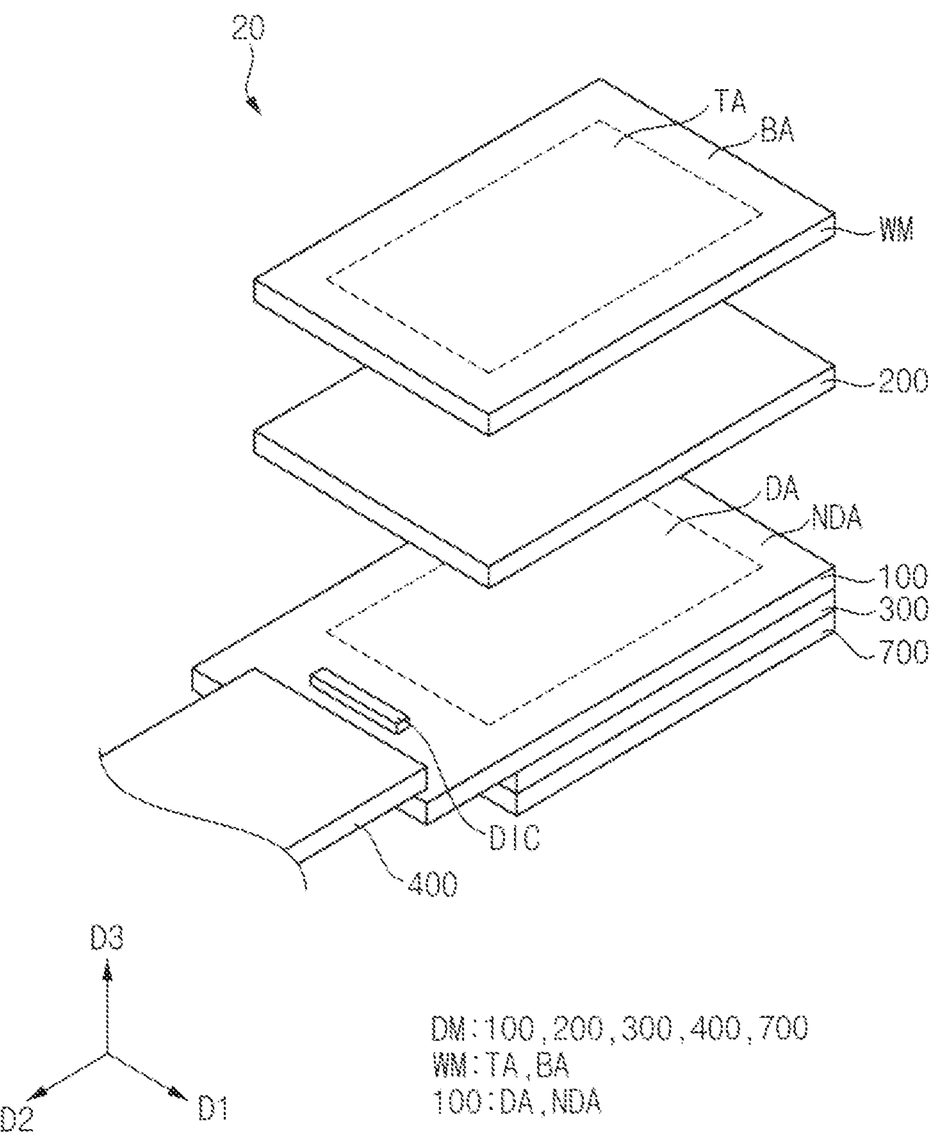
FIG. 8 is a schematic exploded perspective view illustrating a display device according to another embodiment.
Figure 9:
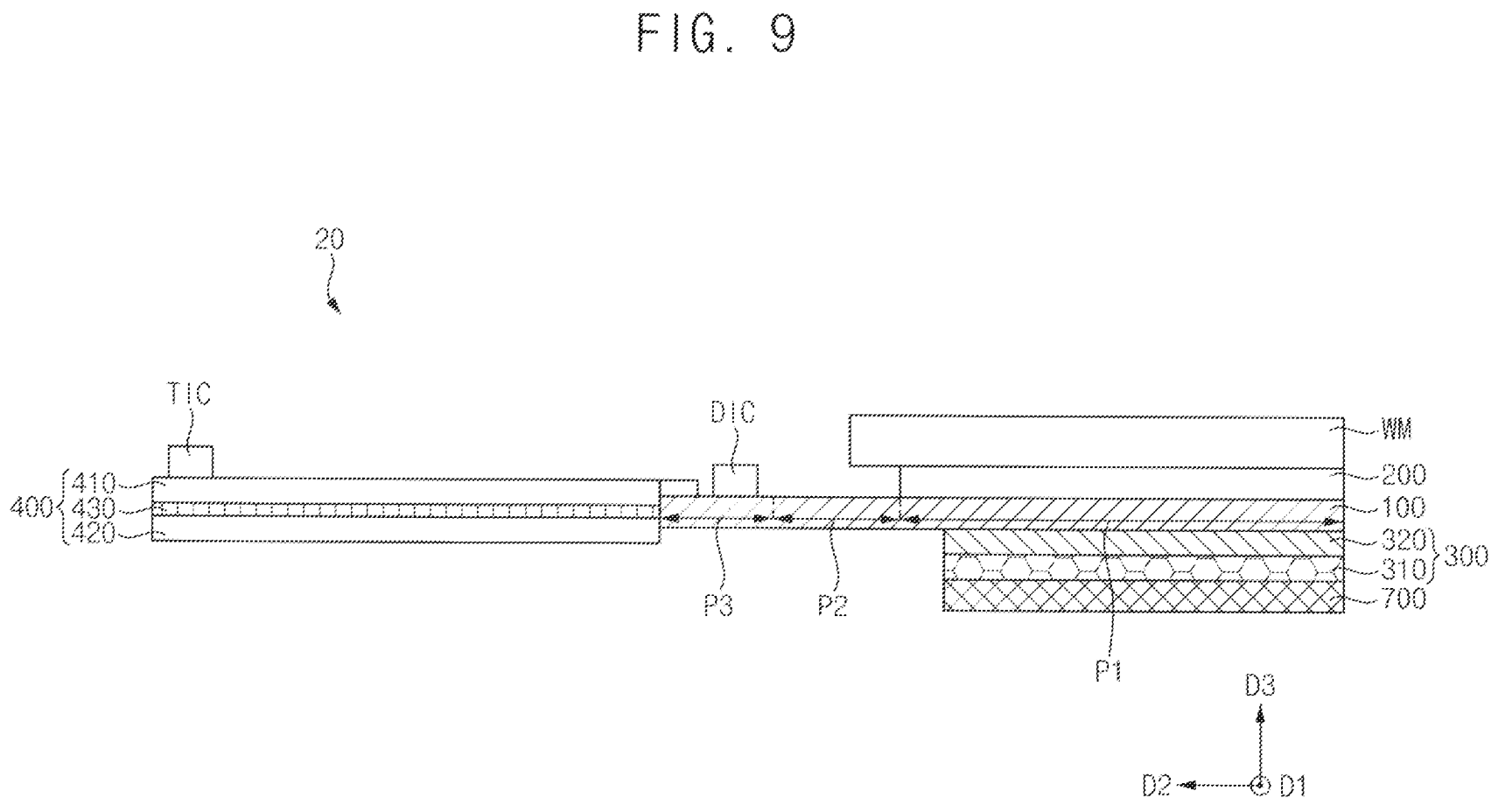
Figure 10:
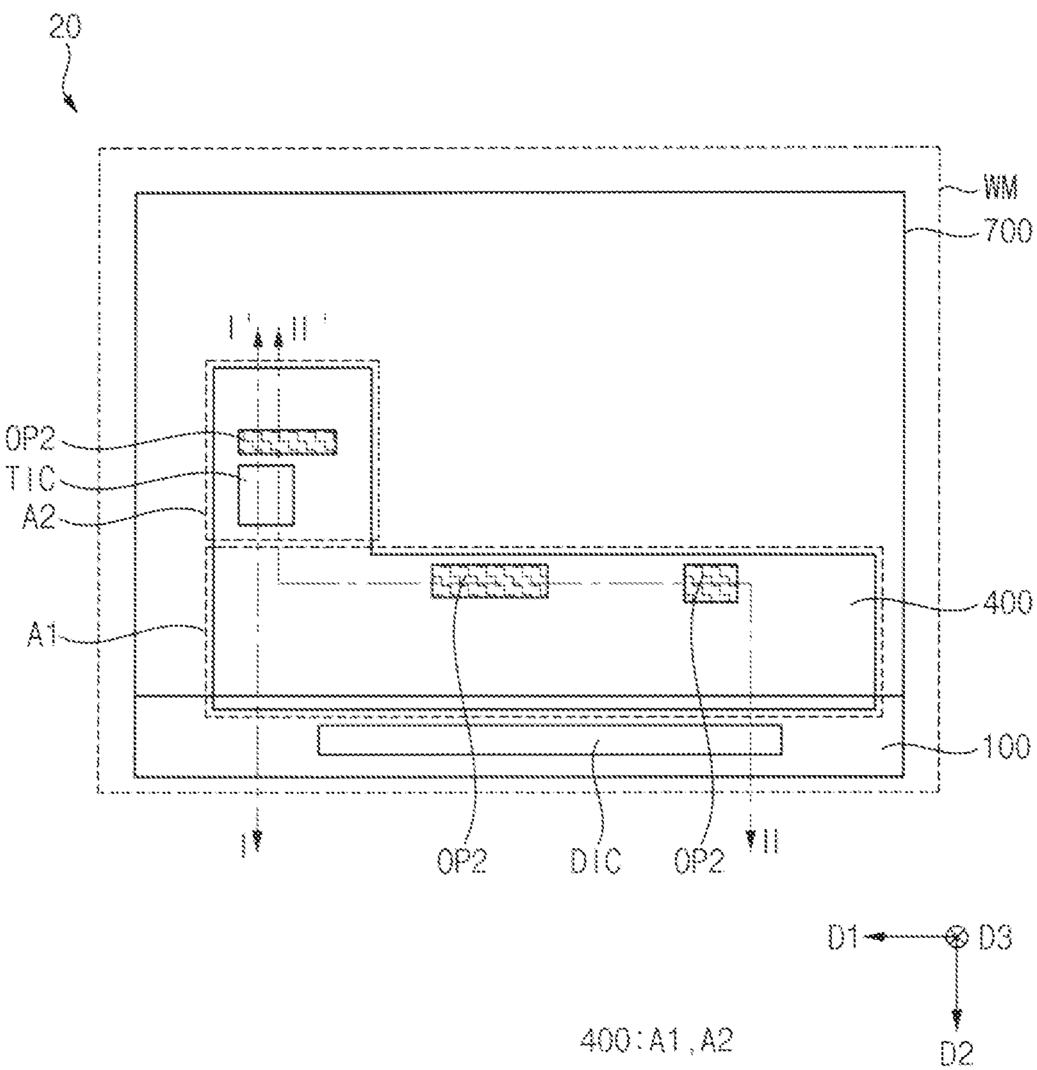
FIG. 10 is a schematic rear view illustrating the display device of FIG. 8.
Figure 11:
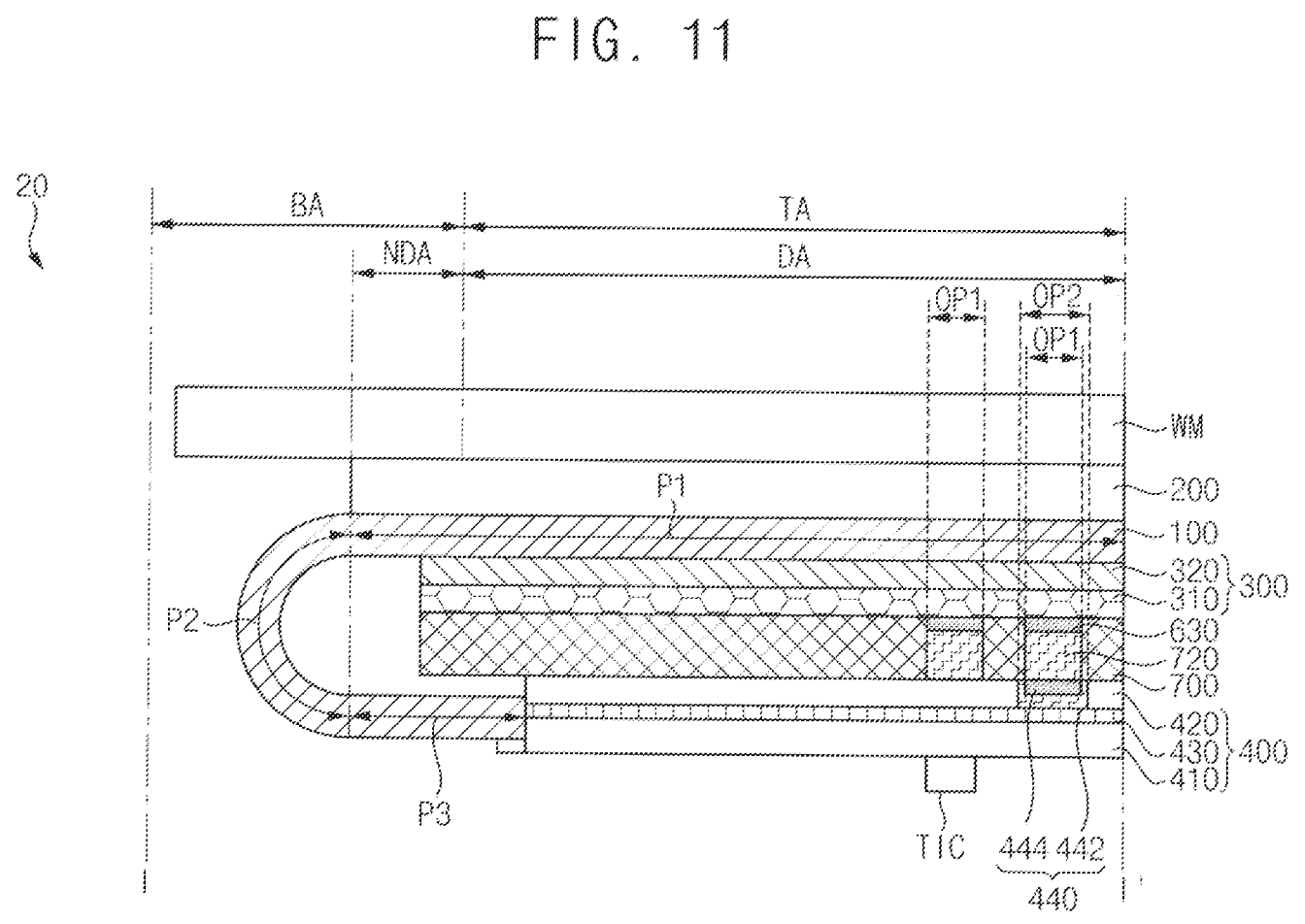
Figure 12:
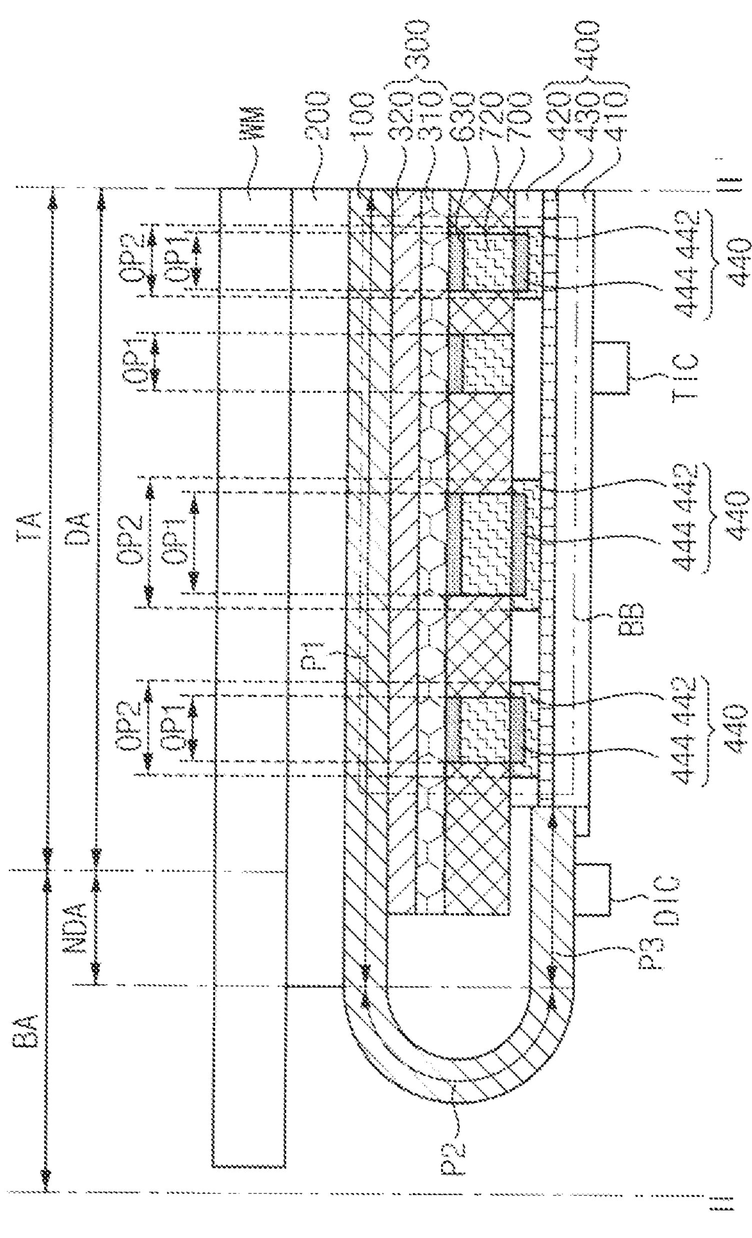
FIG. 12 is a schematic cross-sectional view taken along line II-II' of FIG. 10.
Figure 13:
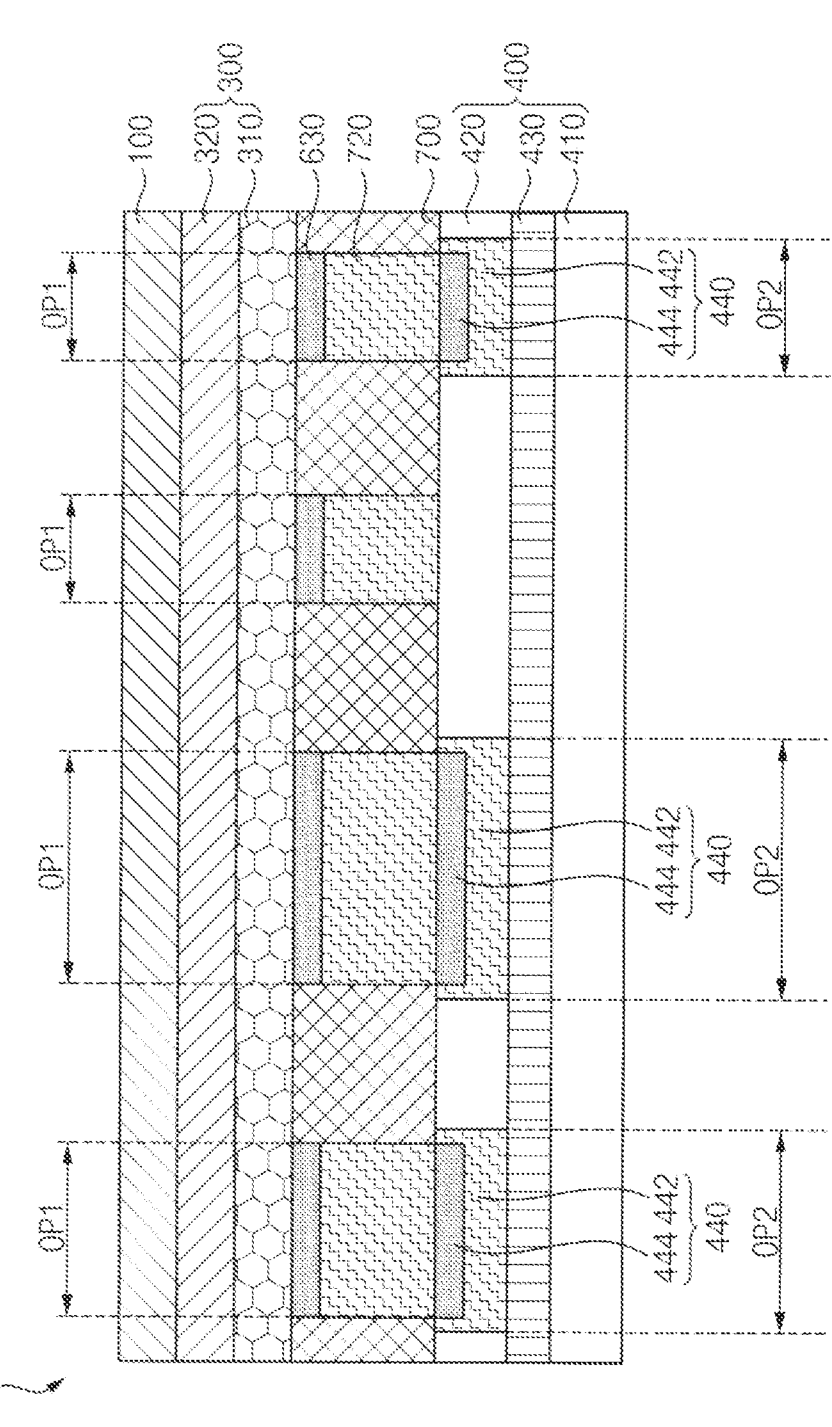
FIG. 13 is a schematic enlarged cross-sectional view of 'BB' of FIG. 12.

FIG. 8 is a schematic exploded perspective view illustrating a display device according to another embodiment. FIG. 9 is a schematic cross-sectional view illustrating the display device of FIG. 8. FIG. 10 is a schematic rear view illustrating the display device of FIG. 8. FIG. 11 is a schematic cross-sectional view taken along line I-I' of FIG. 10. FIG. 12 is a schematic cross-sectional view taken along line II-II' of FIG. 10. FIG. 13 is a schematic enlarged cross-sectional view of 'BB' of FIG. 12.

An embodiment of a display device 20 shown in FIGS. 8 to 13 may be different from the embodiment of the display device 10 described above with reference to FIGS. 1 to 7 at least in a heat dissipation layer 700 and a first metal sheet 720.

In an embodiment, the display device 20 may include the heat dissipation layer 700 disposed between a circuit board 400 and a support member 300. For example, the heat dissipation layer 700 may be disposed under the support member 300. As a display panel 100 unfolded as shown in FIG. 9 is bent as shown in FIGS. 10 to 13, the circuit board 400 electrically connected to the display panel 100 may be disposed under the display panel 100.

The circuit board 400 may be bonded to the heat dissipation layer 700.

In an embodiment, the heat dissipation layer 700 may include graphite. The heat dissipation layer 700 may include a first opening OP1 which exposes the support member 300.

For example, the first metal sheet 720 may be disposed on the support member 300 to correspond to the first opening OP1.

The first metal sheet 720 may include materials which have conductivity. In an embodiment, the first metal sheet 720 may include the same materials as the metal sheet 500 described above in a description of the display device 10. Examples of the materials that may be included in the first metal sheet 720 may include copper, gold, silver, aluminum, or the like. The materials may be used alone or in combination with each other.

The first metal sheet 720 may compensate for a step difference of the heat dissipation layer 700 due to the first opening OP1. For example, the first metal sheet 720 may have a thickness sufficient to compensate for the step difference with the heat dissipation layer 700. The first metal sheet 720 may be electrically connected to a portion of the support member 300 exposed by the first opening OP1.

In an embodiment, a third adhesive film 630 may be disposed between the first metal sheet 720 and the support member 300. For example, the third adhesive film 630 may be a double-sided adhesive film. Accordingly, the first metal sheet 720 may be bonded to the support member 300 by the third adhesive film 630. The third adhesive film 630 may be an anisotropic conductive adhesive film. Accordingly, the first metal sheet 720 may be electrically connected to the support member 300 by the third adhesive film 630.

On the support member 300, an area where the first metal sheet 720 is disposed corresponding to the first opening OP1 of the heat dissipation layer 700 may be various.

Examples of the areas where the first metal sheet 720 is disposed may include an area overlapping a second opening OP2 of the circuit board 400, an area overlapping a touch driving chip TIC mounted on the circuit board 400, an area overlapping a panel driving chip DIC mounted on the display panel 100, or the like. For example, the second opening OP2 may be substantially same as the opening OP described with reference to FIGS. 1 to 7.

FIGS. 10 to 12 illustrate a case in which the first metal sheet 720 overlaps the second opening OP2 and the touch driving chip TIC of the circuit board 400. However, the disclosure is not limited thereto, and some of the first openings OP1 and some of the first metal sheets 720 may be omitted, and the first opening OP1 and the first metal sheet 720 overlapping the panel driving chip DIC may be additionally disposed. For example, the first metal sheet 720 may be disposed on the support member 300 to overlap at least one selected from the second opening OP2 of the circuit board 400, the touch driving chip TIC, and the panel driving chip DIC.

In case that the first metal sheet 720 may overlap the second opening OP2 of the circuit board 400, the first metal sheet 720 may also be electrically connected to a ground wire 430.

In an embodiment, the first metal sheet 720 may be electrically connected to the ground wire 430 by a step compensation film 440 of the circuit board 400. For example, a conductive tape 444 included in the step compensation film 440 may bond the first metal sheet 720 to the circuit board 400. For example, the heat dissipation layer 700 around the first metal sheet 720 may be bonded to the circuit board 400 in a form of being placed on the circuit board 400.

In another embodiment, the display device 20 may further include a separate adhesive layer (not shown) disposed between the heat dissipation layer 700 and the circuit board 400. For example, the adhesive layer may have conductivity. Accordingly, the first metal sheet 720 may be electrically connected to the ground wire 430 by the adhesive layer and the step compensation film 440 therebetween. The adhesive layer may be adhesive on sides. Accordingly, the adhesive layer may more firmly bond the heat dissipation layer 700 around the first metal sheet 720 to the circuit board 400. The first metal sheet 720 may be more firmly bonded to the circuit board 400 by the adhesive layer and the conductive tape 444 therebetween.

According to embodiments, since the display device 20 includes the heat dissipation layer 700 and the first metal sheet 720 which are disposed between the circuit board 400 and the support member 300, the heat dissipation characteristic and the resistance characteristic of the display device 20 may be improved. For example, since the heat dissipation layer 700 includes the graphite, and the first metal sheet 720 disposed to correspond to the first opening OP1 of the heat dissipation layer 700, an excellent heat dissipation characteristic of the graphite and an excellent heat dissipation characteristic of the first metal sheet 720 may be simultaneously expressed. For example, since the first metal sheet 720 overlaps an area where excessive heat is generated, the heat dissipation characteristic of the display device 20 may be further improved. Examples of such areas where excessive heat is generated may include an area where the panel driving chip DIC is mounted, an area where the touch driving chip TIC is mounted, and the like.

Since the first metal sheet 720 overlaps the second opening OP2 of the circuit board 400, and the first metal sheet 720 is electrically connected (e.g., directly electrically connected) to the wire of the circuit board 400 and the support member 300, an additional arrangement of a separate conductive layer between the circuit board 400 and the support member 300 may not be required. Accordingly, the change in resistance may be minimized, and the low resistance may be stably maintained.

Figure 14:
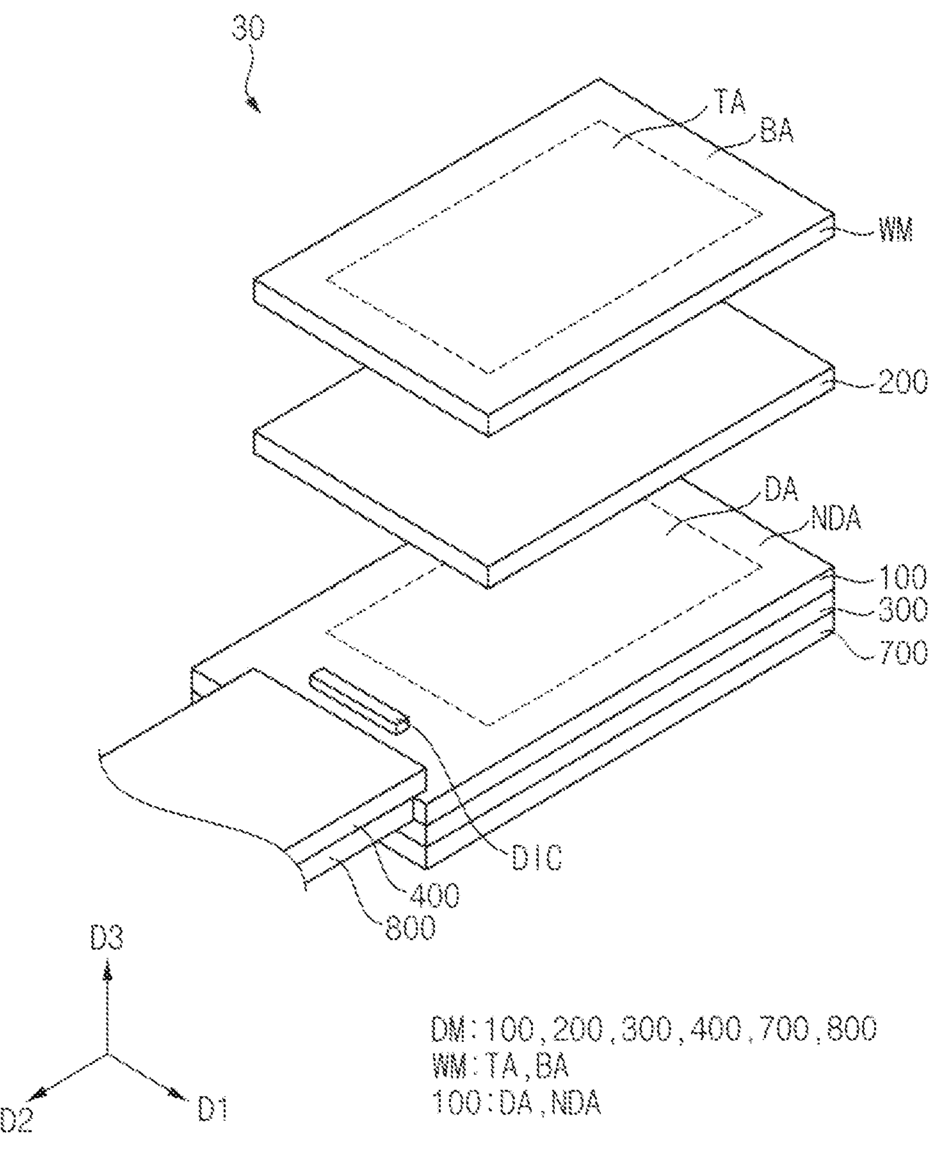
FIG. 14 is a schematic exploded perspective view illustrating a display device according to another embodiment.
Figure 15:
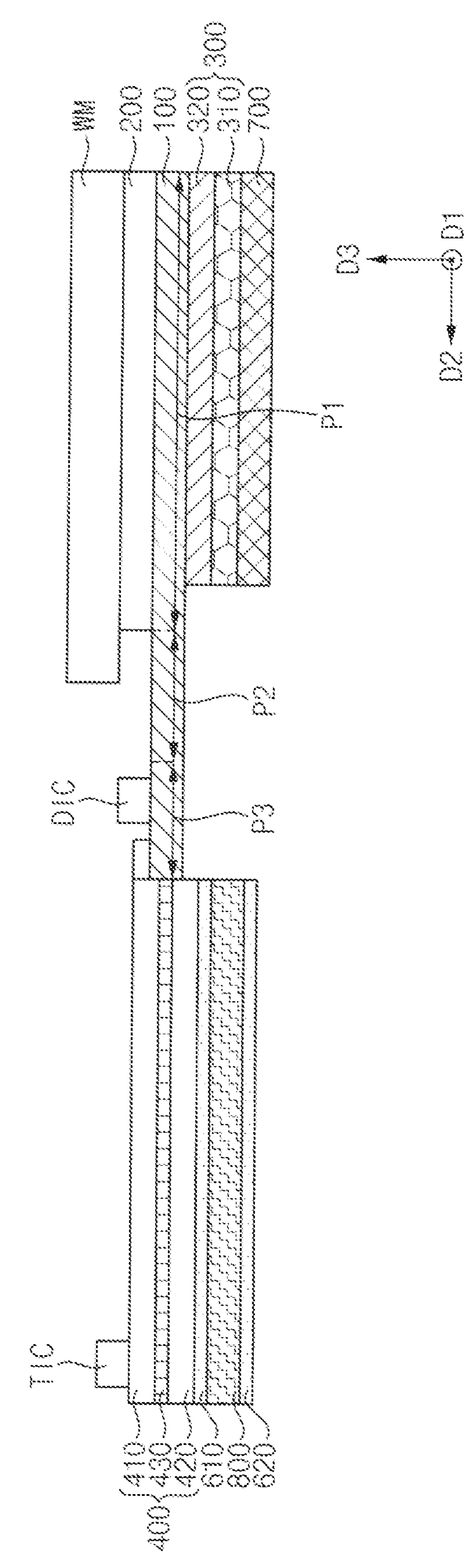
FIG. 15 is a schematic cross-sectional view illustrating the display device of FIG. 14.
Figure 16:
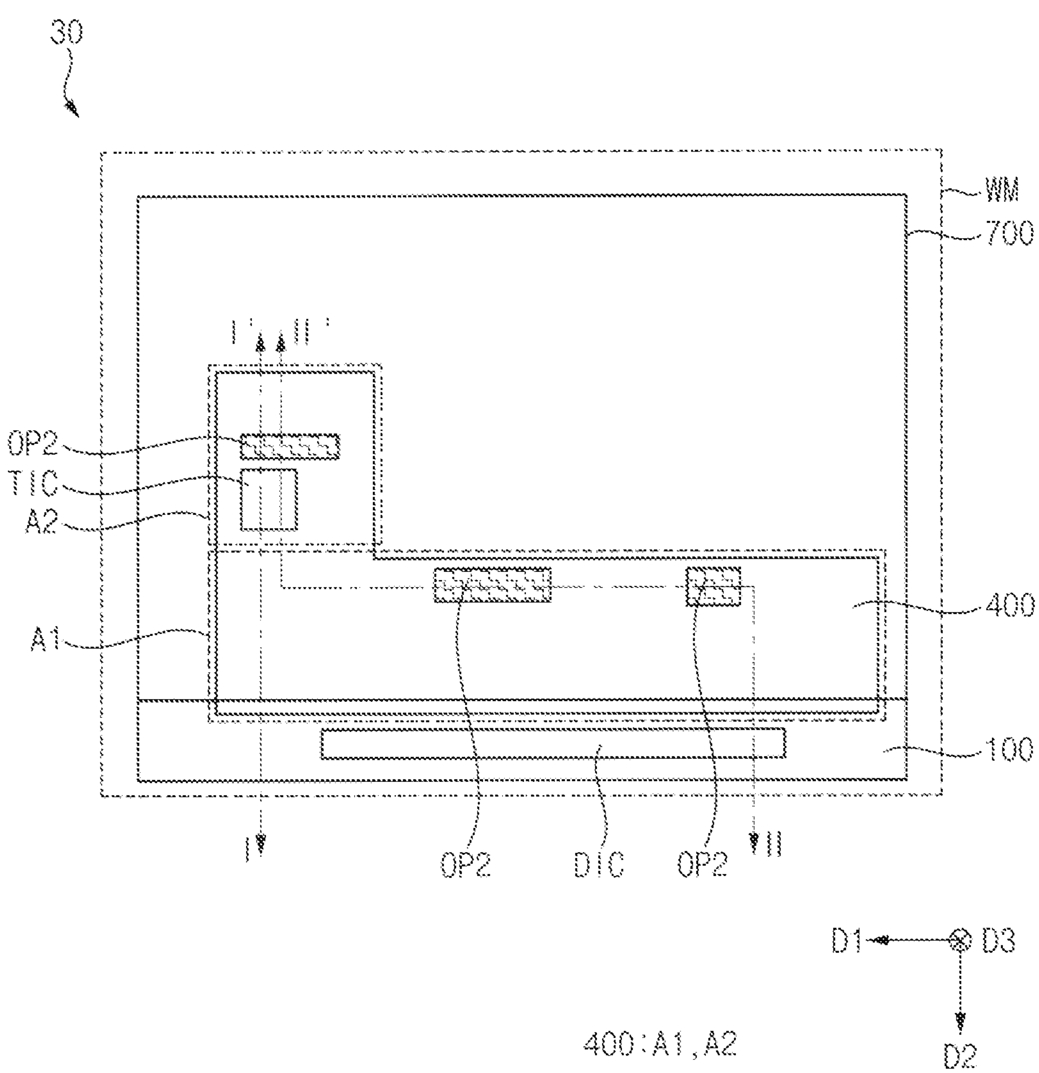
FIG. 16 is a schematic rear view illustrating the display device of FIG. 14.
Figure 17:
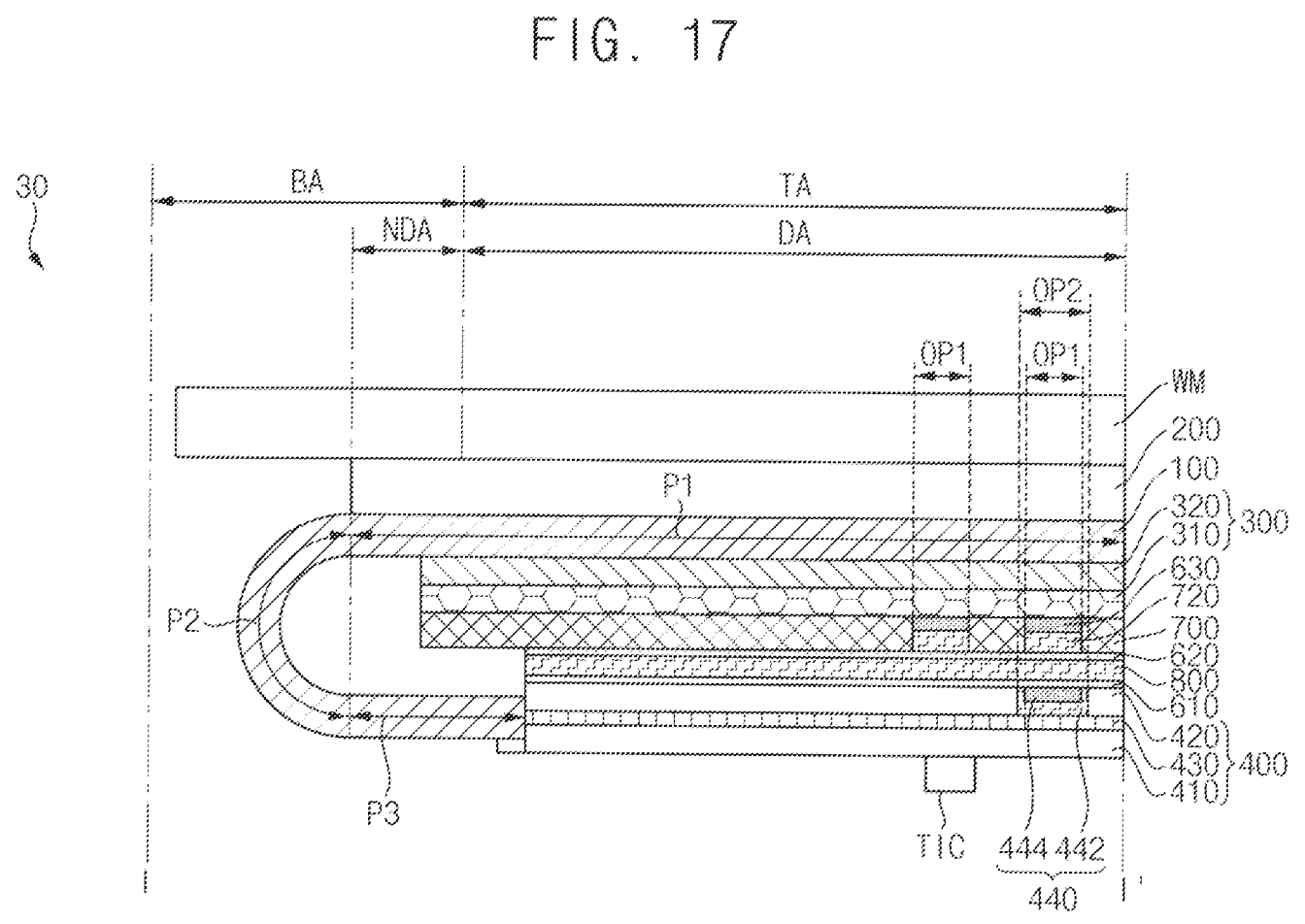
Figure 18:
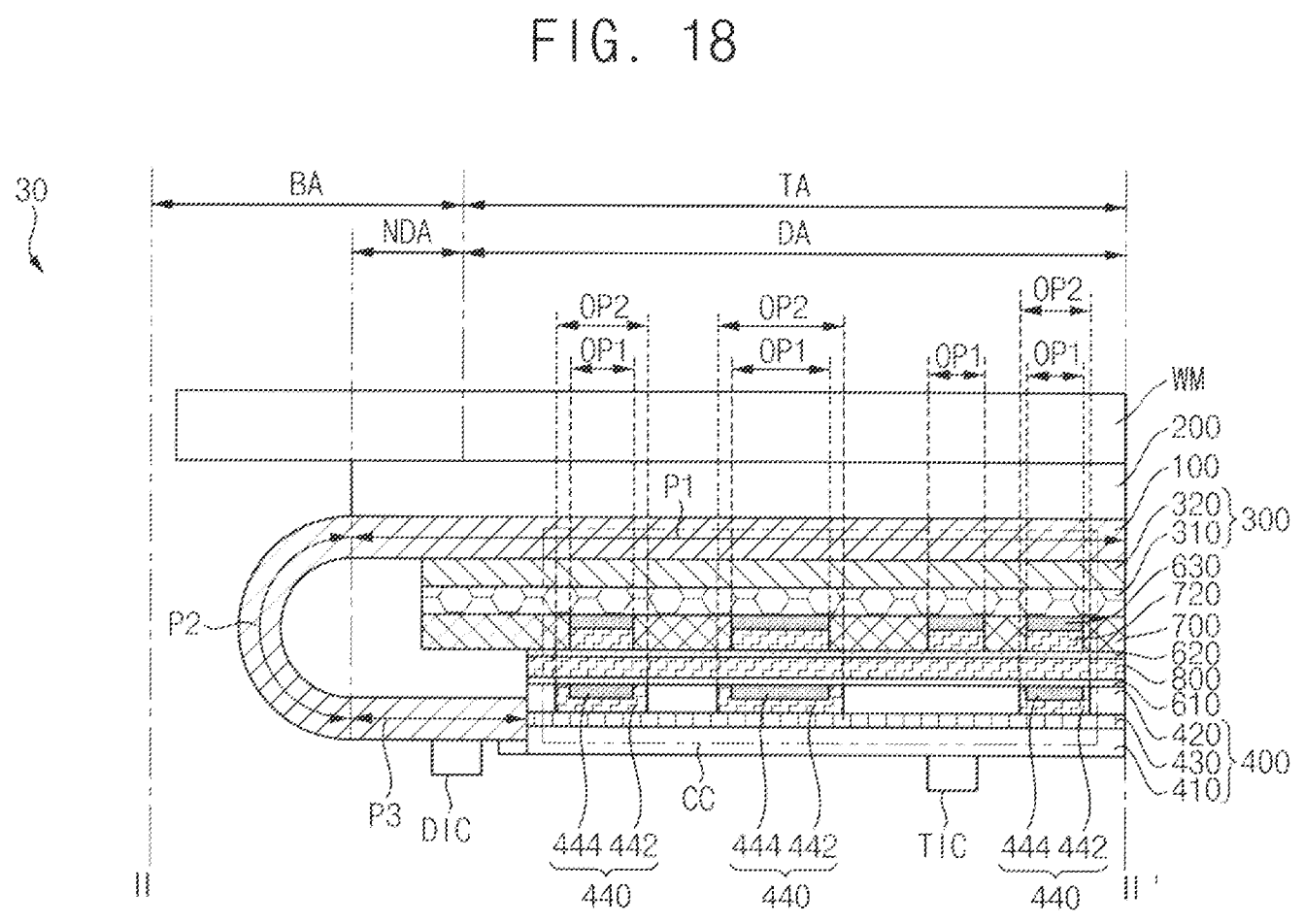
Figure 19:
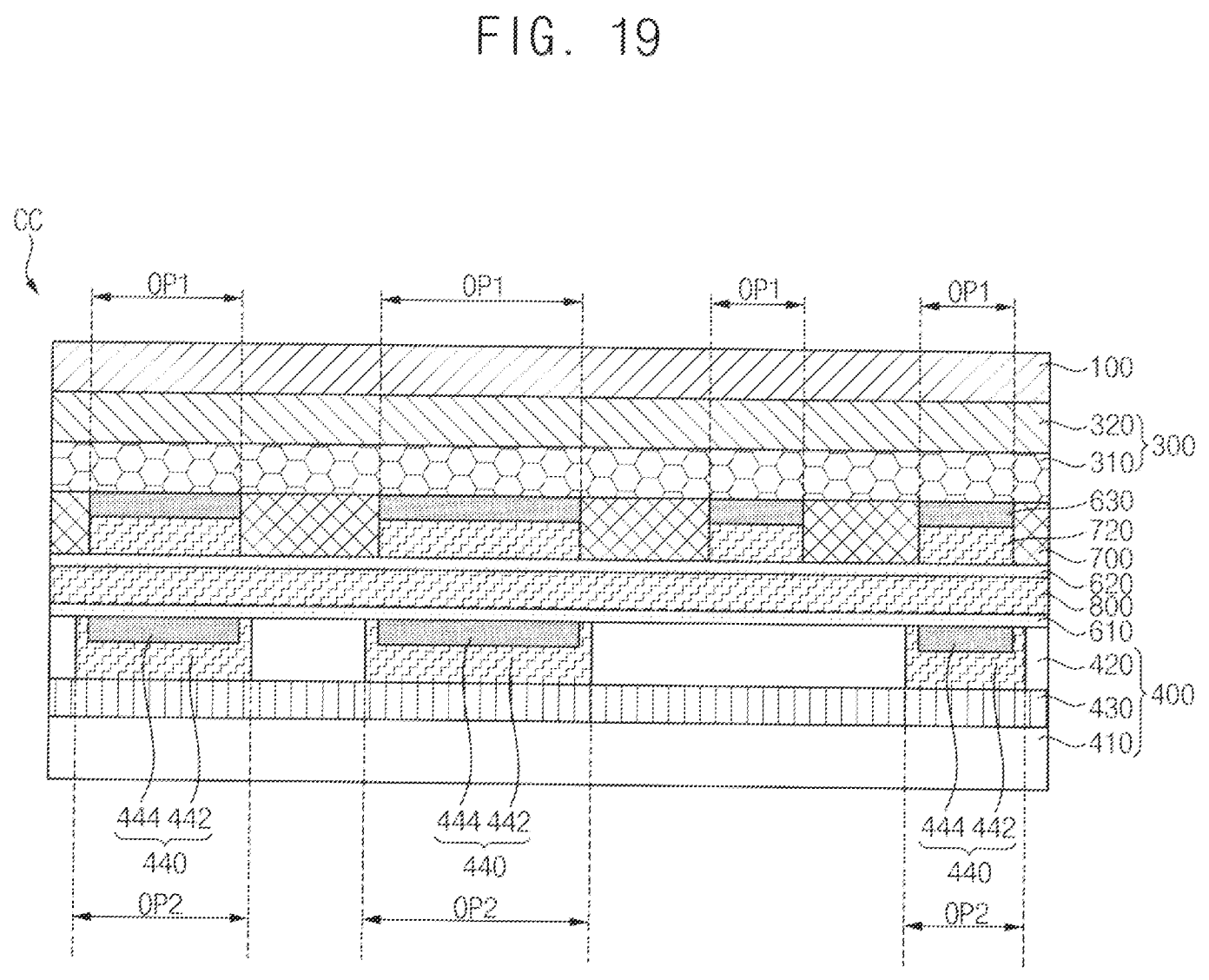

FIG. 14 is a schematic exploded perspective view illustrating a display device according to another embodiment. FIG. 15 is a schematic cross-sectional view illustrating the display device of FIG. 14. FIG. 16 is a schematic rear view illustrating the display device of FIG. 14. FIG. 17 is a schematic cross-sectional view taken along line I-I' of FIG. 16. FIG. 18 is a schematic cross-sectional view taken along line II-II' of FIG. 16. FIG. 19 is a schematic enlarged cross-sectional view of 'CC' of FIG. 18.

An embodiment of a display device 30 shown in FIGS. 14 to 19 may be different from the embodiment of the display device 20 described above with reference to FIGS. 8 to 13 at least in a second metal sheet 800.

In an embodiment, the display device 30 may include a heat dissipation layer 700, a first metal sheet 720, and a second metal sheet 800 which are disposed between a circuit board 400 and a support member 300. The heat dissipation layer 700 may be disposed under the support member 300, and the second metal sheet 800 may be bonded onto the second cover layer 420 of the circuit board 400 electrically connected to a display panel 100. Accordingly, as the display panel 100 unfolded as shown in FIG. 15 is bent as shown in FIGS. 16 to 19, the circuit board 400 electrically connected to the display panel 100 may be disposed under the display panel 100. The second metal sheet 800 bonded to the circuit board 400 may be bonded to the heat dissipation layer 700.

In an embodiment, the heat dissipation layer 700 may include graphite, and the heat dissipation layer 700 may include a first opening OP1 which exposes the support member 300. The first metal sheet 720 may be disposed on the support member 300 to correspond to the first opening OP1.

The second metal sheet 800 may include a conductive material. In an embodiment, the second metal sheet 800 may include the same material as the first metal sheet 720 described above in a description of the display device 20. Examples of the materials that may be included in the second metal sheet 800 may include copper, gold, silver, aluminum, or the like. The materials may be used alone or in combination with each other.

In an embodiment, each of a first adhesive film 610 and a second adhesive film 620 may be disposed on surfaces of the second metal sheet 800. For example, each of the first adhesive film 610 and the second adhesive film 620 may be a double-sided adhesive film. Accordingly, the first adhesive film 610 may bond the second metal sheet 800 to the second cover layer 420. As the display panel 100 is bent, the second metal sheet 800 may be bonded to the heat dissipation layer 700 by the second adhesive film 620.

In an embodiment, each of the first adhesive film 610 and the second adhesive film 620 may be an anisotropic conductive adhesive film. Accordingly, some wires (e.g., a ground wire 430) of the circuit board 400 may be electrically connected to the second metal sheet 800 by a step compensation film 440 and the first adhesive film 610 therebetween. The second metal sheet 800 may be electrically connected to the first metal sheet 720 of the heat dissipation layer 700 by the second adhesive film 620. For example, the circuit board 400 may be electrically connected to the support member 300 by the step compensation film 440, the first adhesive film 610, the second adhesive film 620, the first metal sheet 720, and the second metal sheet 800.

Figure 20:
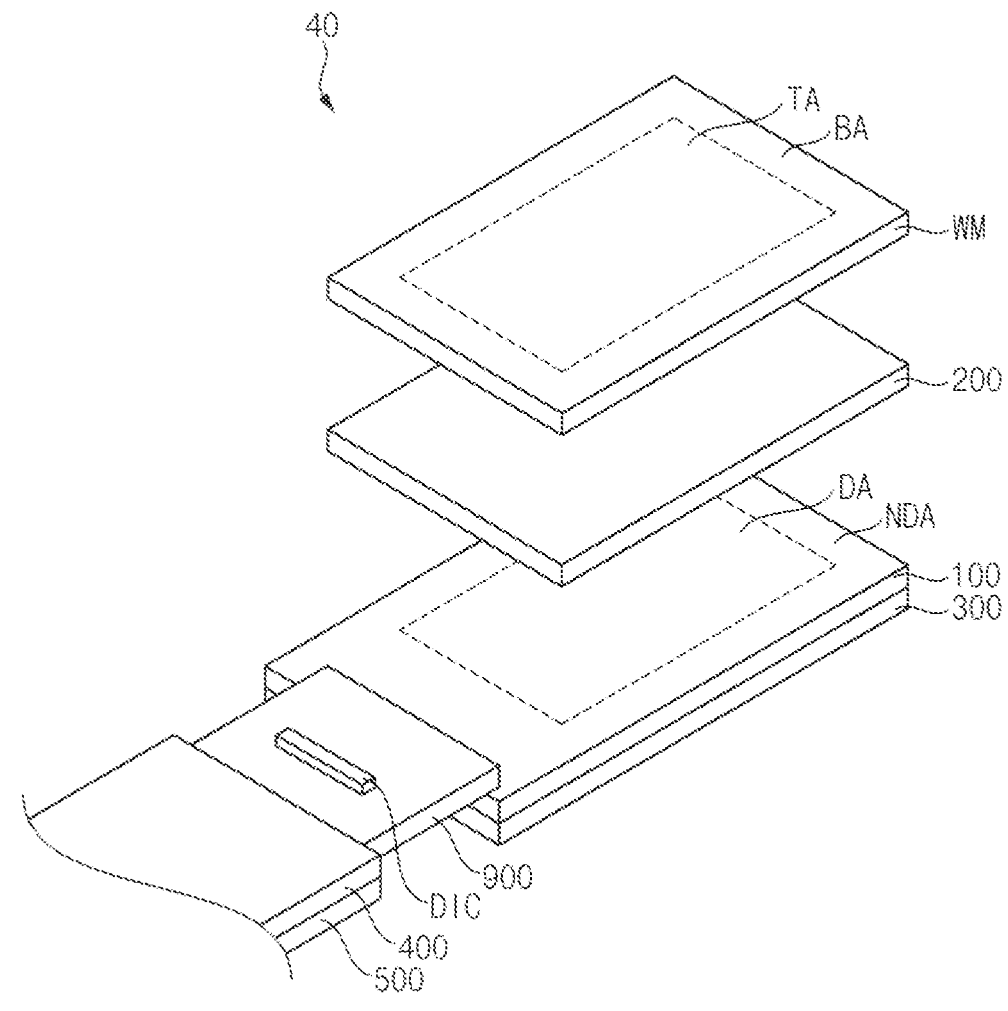
FIG. 20 is a schematic exploded perspective view illustrating a display device according to another embodiment.
Figure 20:
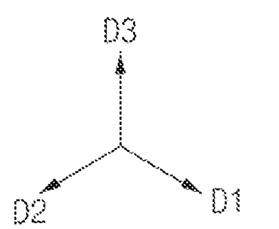
Figure 21:
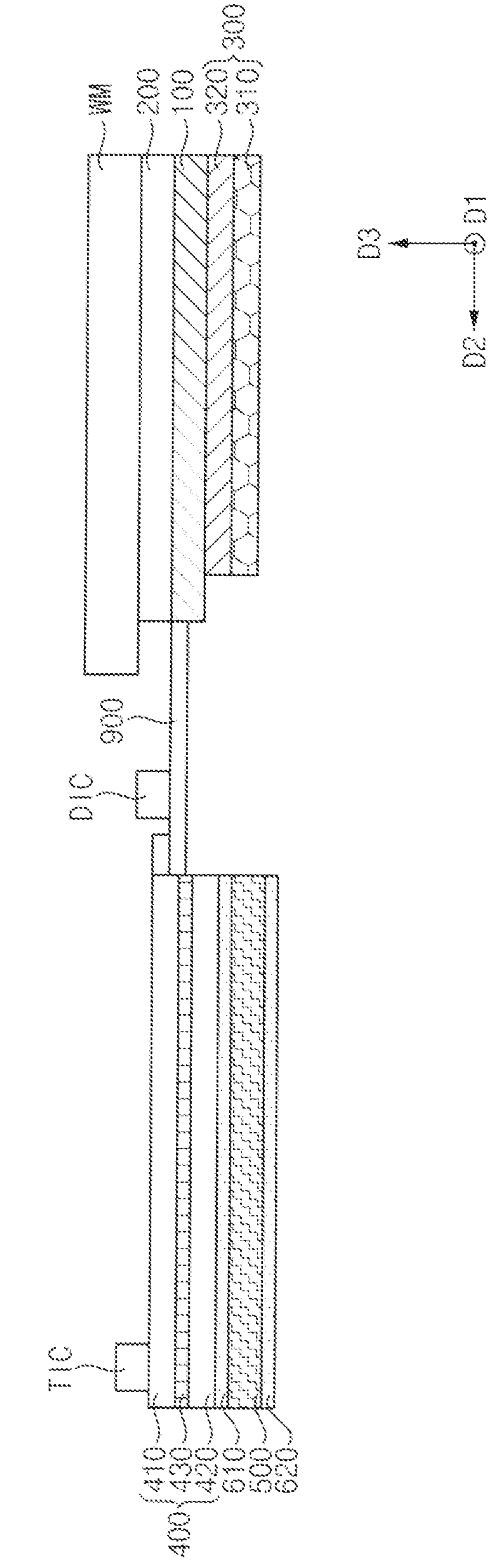
FIG. 21 and FIG. 22 are schematic cross-sectional views illustrating the display device of FIG. 20.
Figure 22:
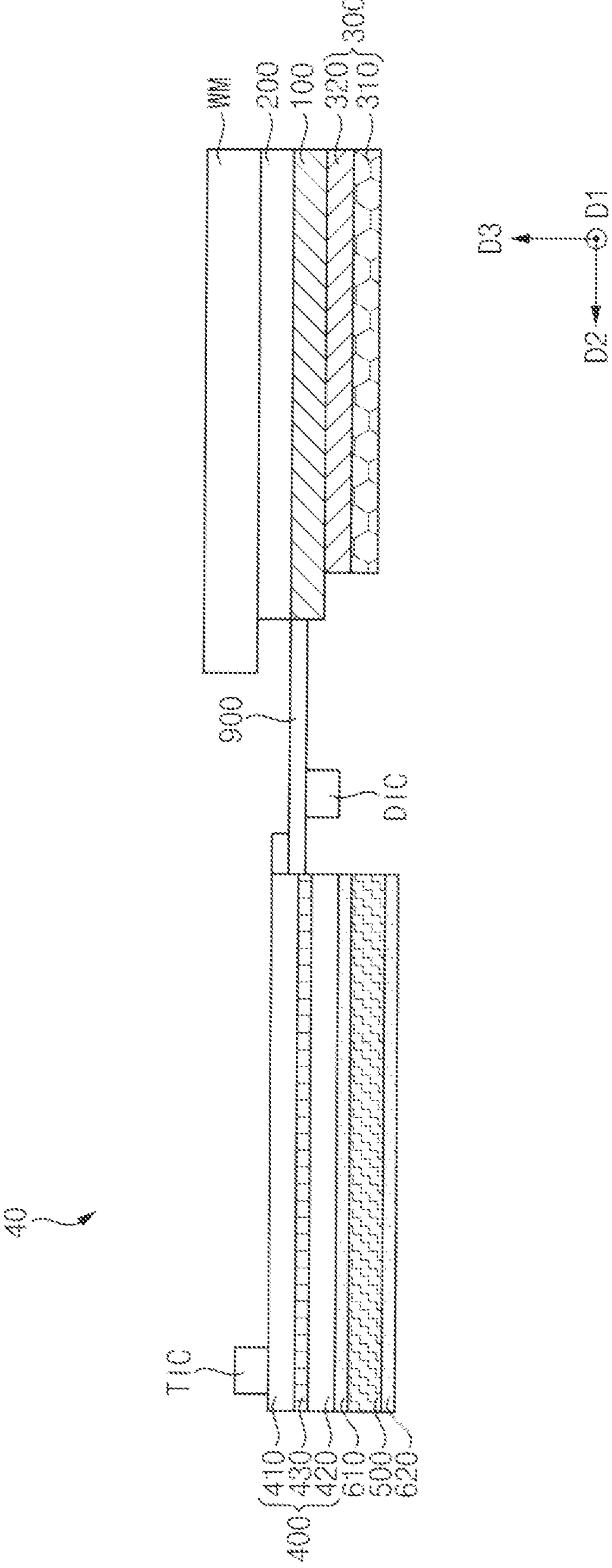
Figure 23:
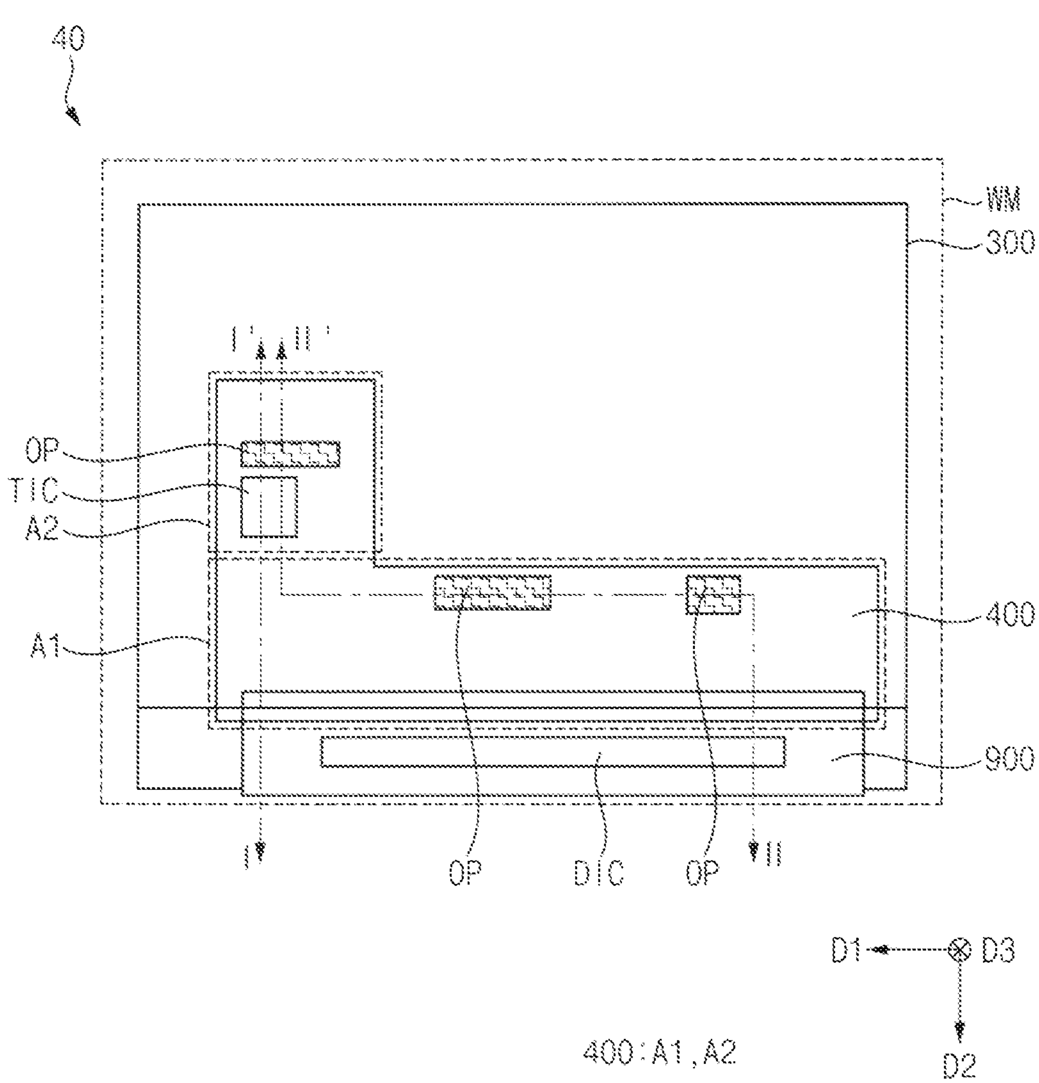
FIG. 23 is a schematic rear view illustrating the display device of FIG. 20.
Figure 24:
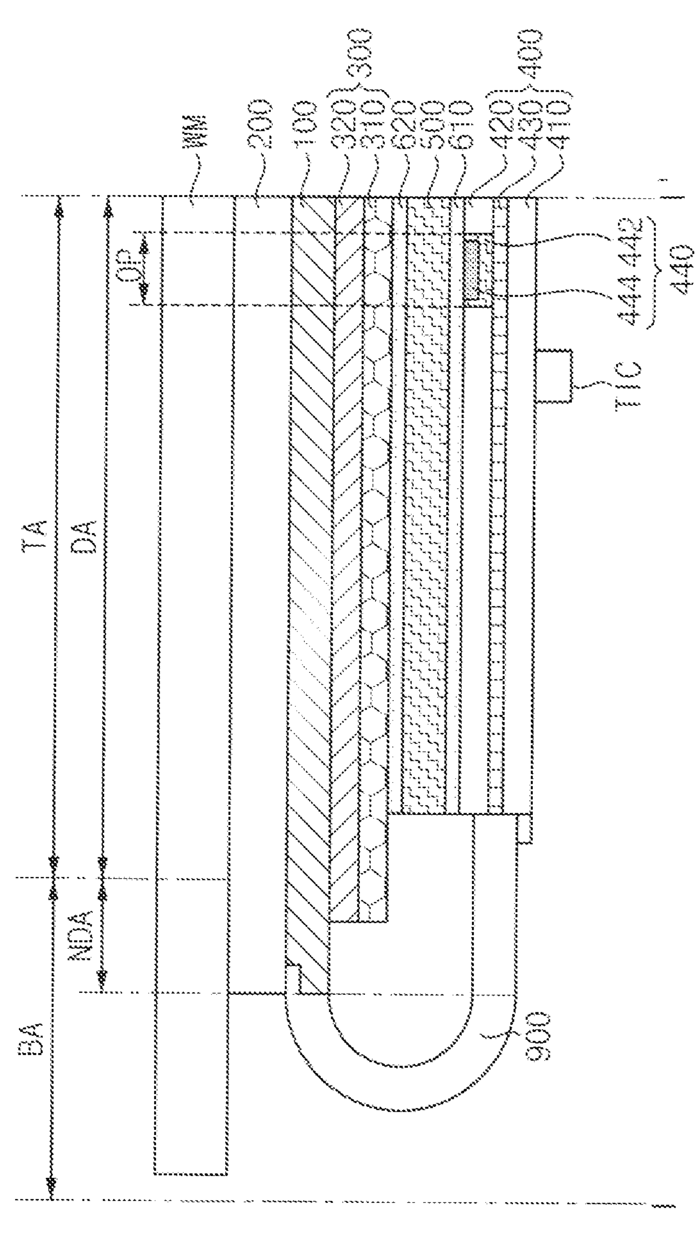
FIG. 24 is a schematic cross-sectional view taken along line I-I' of FIG. 23.
Figure 25:
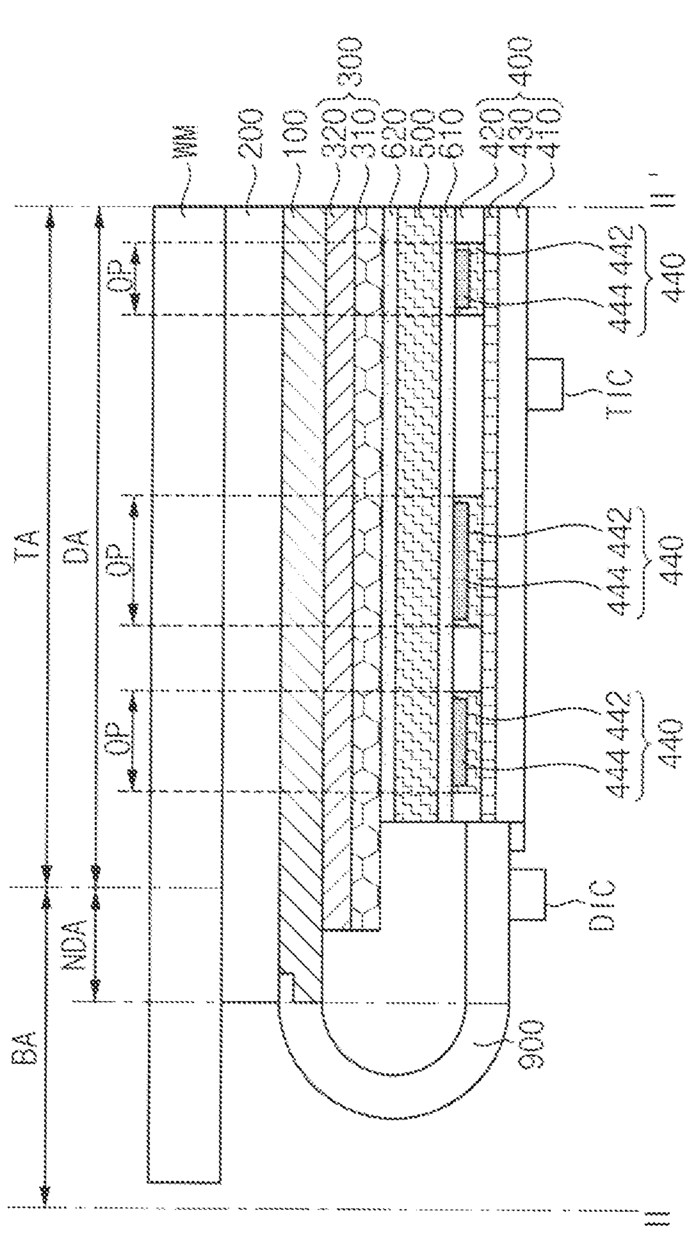
FIG. 25 is a schematic cross-sectional view taken along line II-II' of FIG. 23.

FIG. 20 is a schematic exploded perspective view illustrating a display device according to another embodiment. FIG. 21 and FIG. 22 are schematic cross-sectional views illustrating the display device of FIG. 20. FIG. 23 is a schematic rear view illustrating the display device of FIG. 20. FIG. 24 is a schematic cross-sectional view taken along line I-I' of FIG. 23. FIG. 25 is a schematic cross-sectional view taken along line II-II' of FIG. 23.

An embodiment of a display device 40 shown in FIGS. 20 to 25 may be different from the embodiment of the display device 10 described above with reference to FIGS. 1 to 7 at least in a flexible circuit film 900.

In an embodiment, the display device 40 may further include the flexible circuit film 900 disposed between a display panel 100 and a circuit board 400. The circuit board 400 may be electrically connected to the display panel 100 by the flexible circuit film 900. A side of the flexible circuit film 900 may be electrically connected to the display panel 100, and another side of the flexible circuit film may be electrically connected to the circuit board 400.

In an embodiment, the flexible circuit film 900 may be electrically connected to a non-display area NDA of the display panel 100 through a bonding process. For example, a panel driving chip DIC may be mounted on the flexible circuit film 900. In an embodiment, as shown in FIG. 21, the panel driving chip DIC may be mounted on an upper surface of the flexible circuit film 900. In another embodiment, as shown in FIG. 3, the panel driving chip DIC may be mounted on a lower surface of flexible circuit film 900. Hereinafter, an example in which the panel driving chip DIC is mounted on the upper surface of flexible circuit film 900 will be described.

In an embodiment, the circuit board 400 may have an 'L'-shaped planar shape in a rear view. For example, the circuit board 400 may include a body part A1 and a protrusion part A2. The body part A1 may extend in the first direction D1 and may be bonded to the flexible circuit film 900 (e.g., directly bonded to the flexible circuit film 900). The protrusion part A2 may be formed to protrude from a side of the body part A1 by a length (e.g., a predetermined or a selectable length). However, the disclosure is not limited thereto, and the shape of the circuit board 400 may be various.

Since the flexible circuit film 900 is bent to surround a side surface of the display panel 100, the panel driving chip DIC and the circuit board 400 which is electrically connected to the flexible circuit film 900 may be disposed under the display panel 100. For example, as the flexible circuit film 900 unfolded as shown in FIG. 21 is bent as shown in FIGS. 23 to 25, the circuit board 400 electrically connected to the flexible circuit film 900 may be disposed under the display panel 100. A metal sheet 500 bonded to the circuit board 400 may be bonded to a support member 300. For example, the display panel 100 may not be bent.

Any repetitive detailed description about a connection relationship between the circuit board 400, the metal sheet 500, and the support member 300 described with reference to FIGS. 1 to 7 will be omitted.

Figure 26:
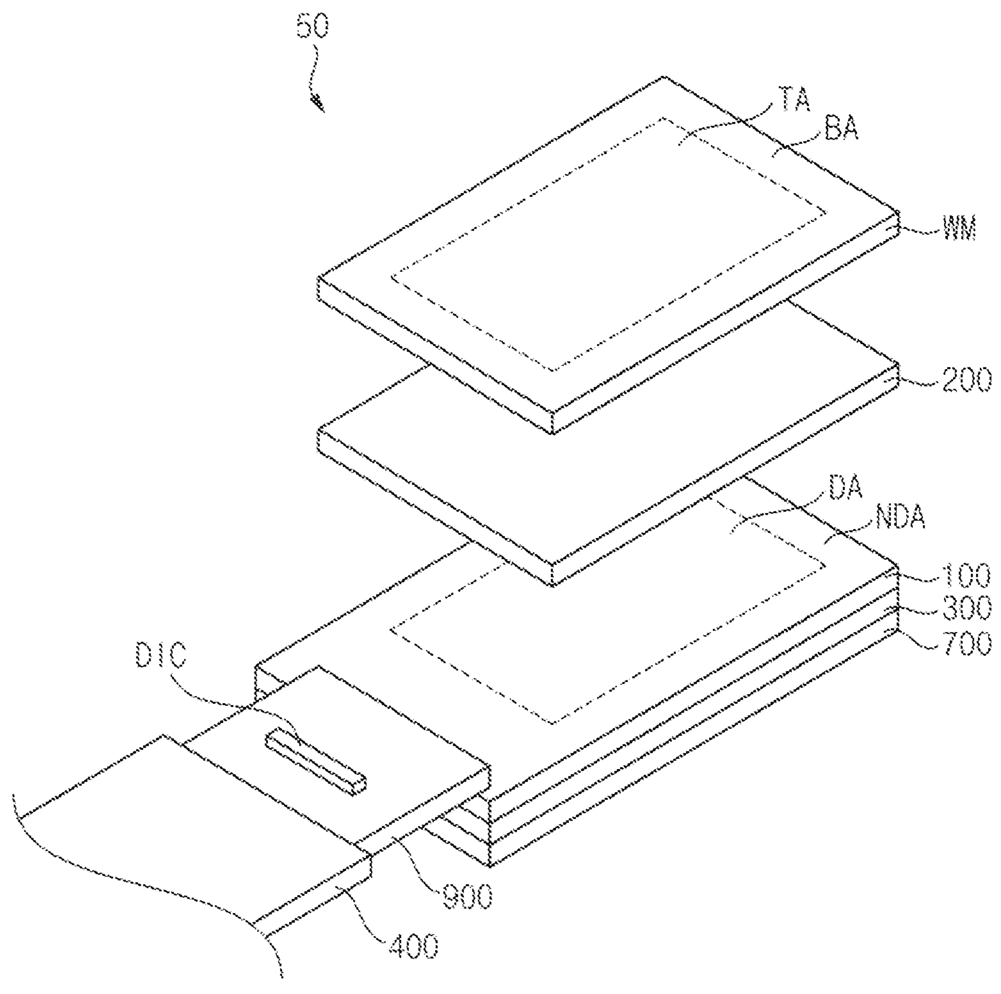
FIG. 26 is a schematic exploded perspective view illustrating a display device according to another embodiment.
Figure 26:
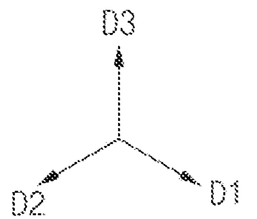
Figure 27:
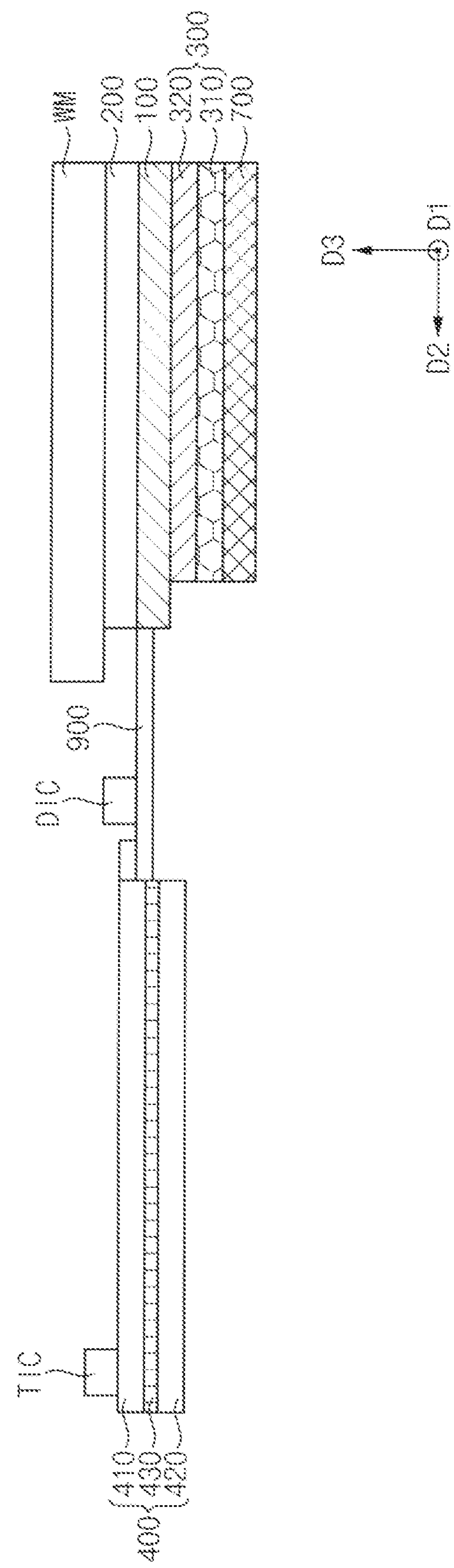
FIG. 27 is a schematic cross-sectional view illustrating the display device of FIG. 26.
Figure 28:
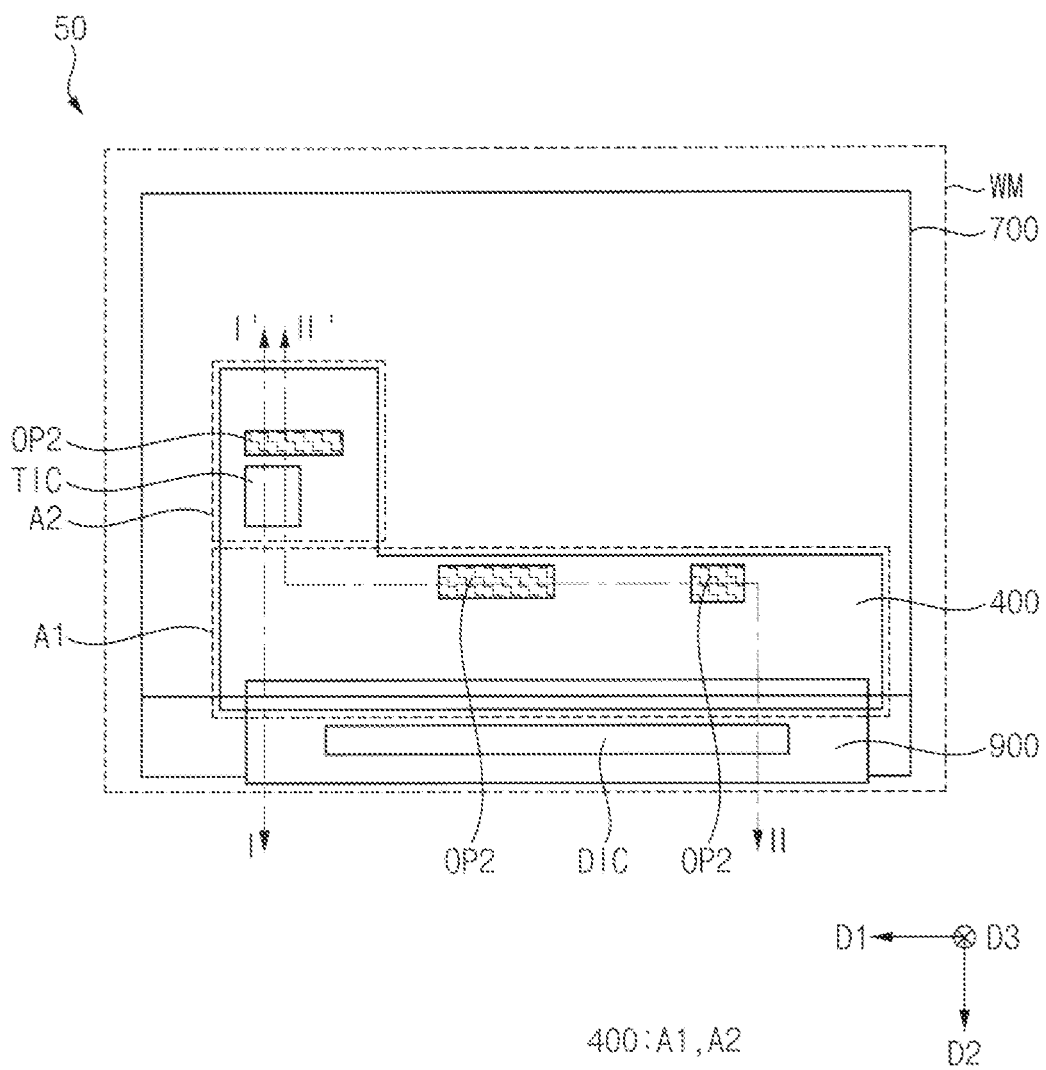
FIG. 28 is a schematic rear view illustrating the display device of FIG. 26.
Figure 29:
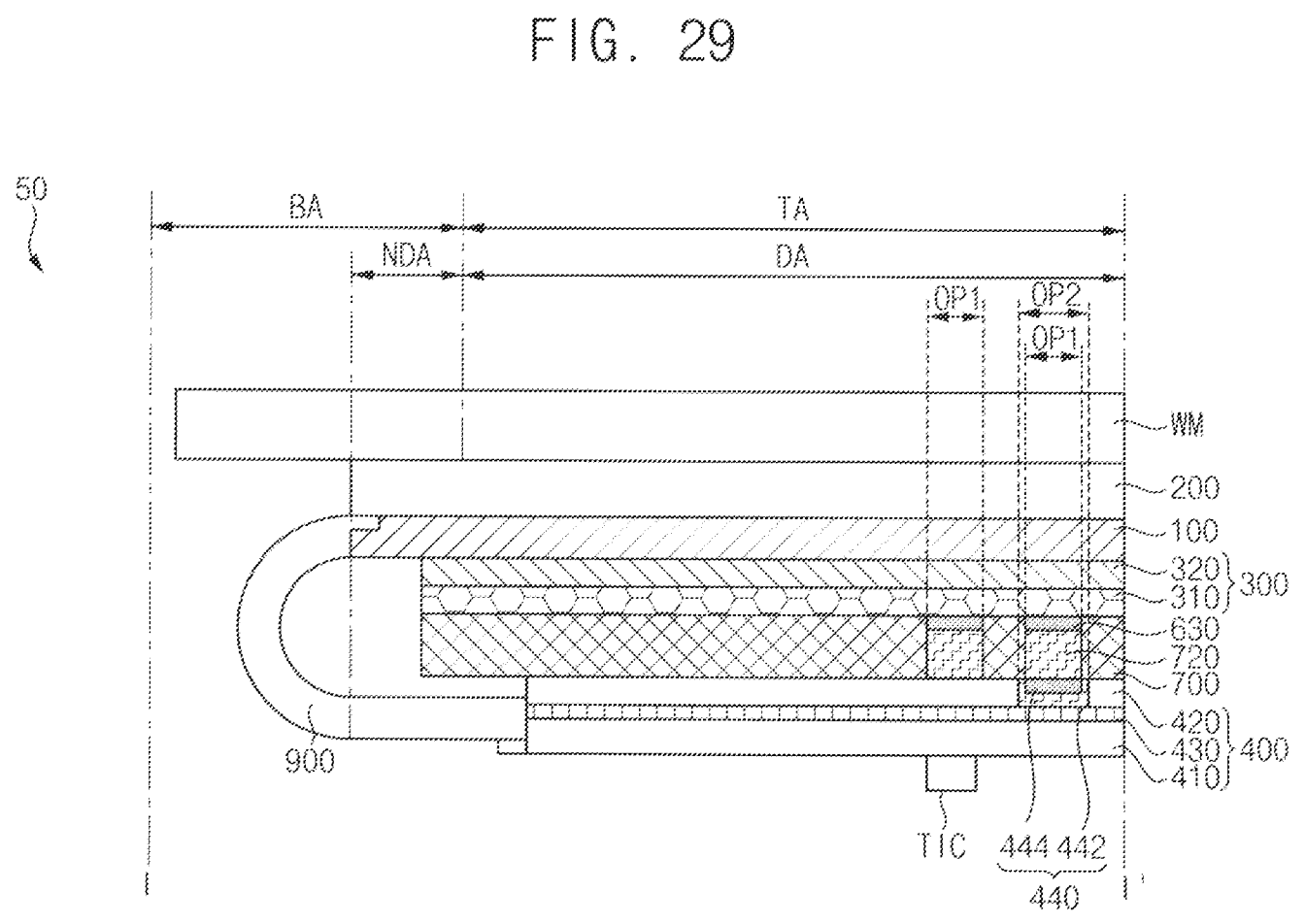
Figure 30:
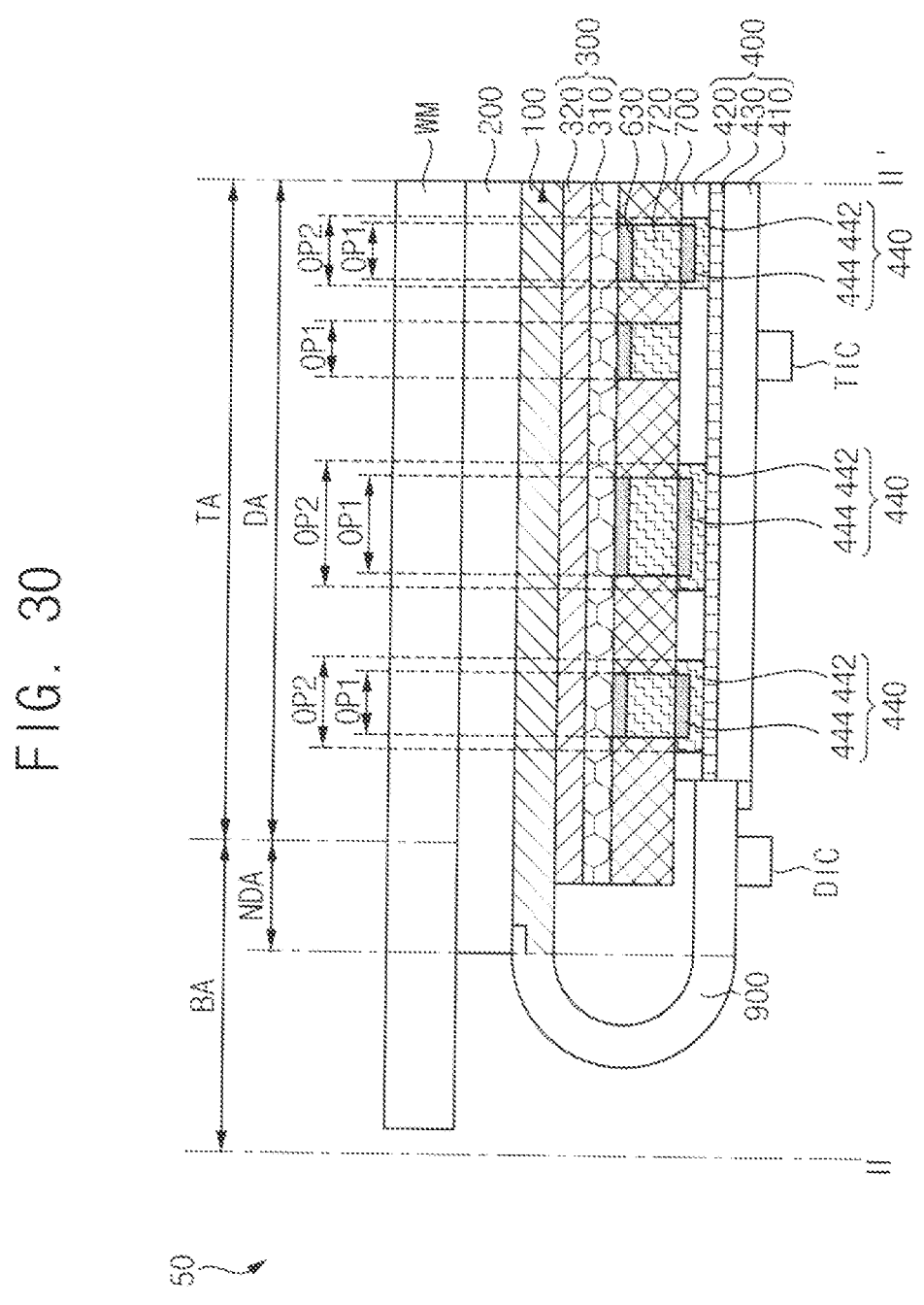

FIG. 26 is a schematic exploded perspective view illustrating a display device according to another embodiment. FIG. 27 is a schematic cross-sectional view illustrating the display device of FIG. 26. FIG. 28 is a schematic rear view illustrating the display device of FIG. 26. FIG. 29 is a schematic cross-sectional view taken along line I-I' of FIG. 28. FIG. 30 is a schematic cross-sectional view taken along line II-II' of FIG. 28.

An embodiment of a display device 50 shown in FIGS. 26 to 30 may be different from the embodiment of the display device 20 described above with reference to FIGS. 8 to 13 at least in a flexible circuit film 900.

In an embodiment, the flexible circuit film 900 of the display device 50 may be substantially same as described above in a description of the display device 40. Accordingly, as the flexible circuit film unfolded as shown in FIG. 27 is bent as shown in FIGS. 28 to 30, a circuit board 400 electrically connected to the flexible circuit film 900 may be disposed under a display panel 100. The circuit board 400 may be bonded to a heat dissipation layer 700.

In an embodiment, a first metal sheet 720 disposed to correspond to a first opening OP1 of the heat dissipation layer 700 may overlap the flexible circuit film 900. For example, the first metal sheet 720 may overlap at least one selected from a second opening OP2 of the circuit board 400, a touch driving chip TIC, a panel driving chip DIC, and the flexible circuit film 900.

Any repetitive detailed description about a connection relationship between the circuit board 400, the heat dissipation layer 700, the first metal sheet 720, and a support member 300 described with reference to FIGS. 8 to 13 will be omitted.

Figure 31:
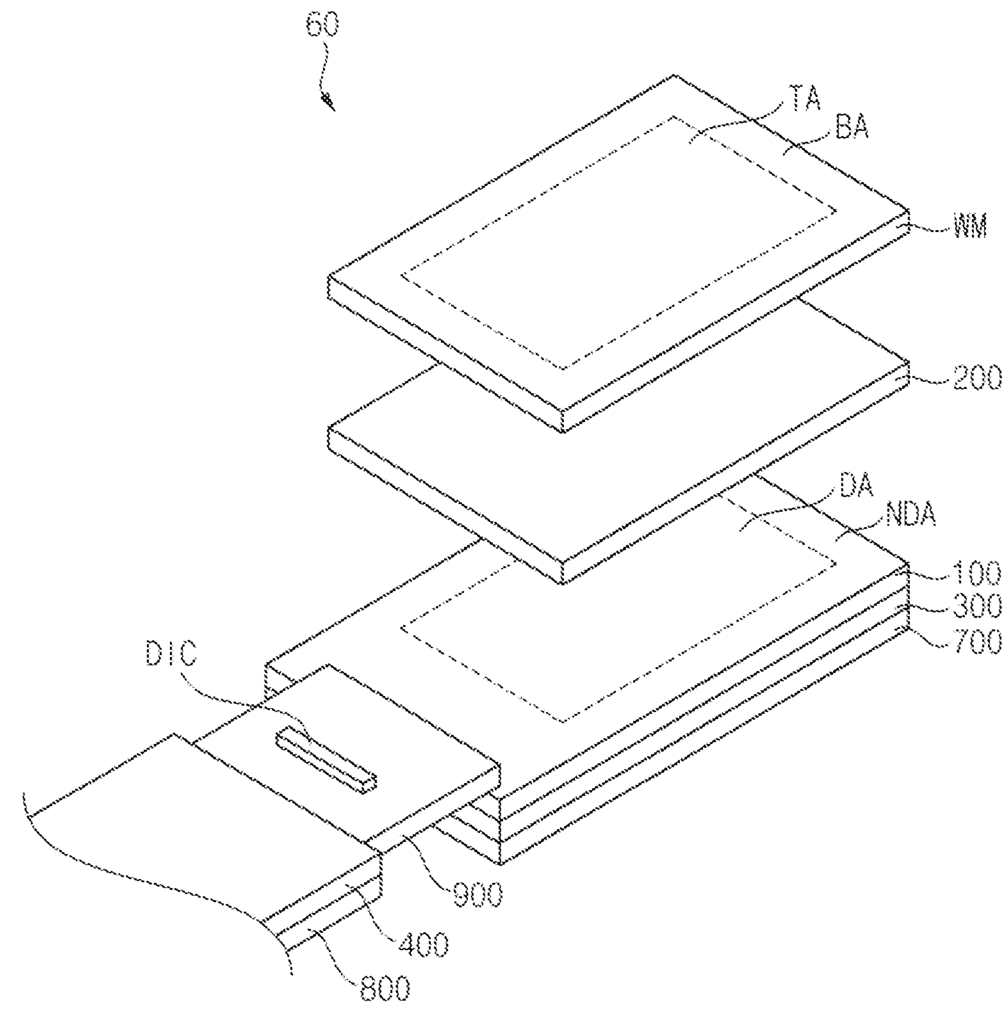
FIG. 31 is a schematic exploded perspective view illustrating a display device according to another embodiment.
Figure 31:
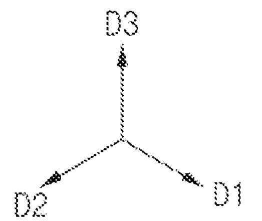
Figure 32:
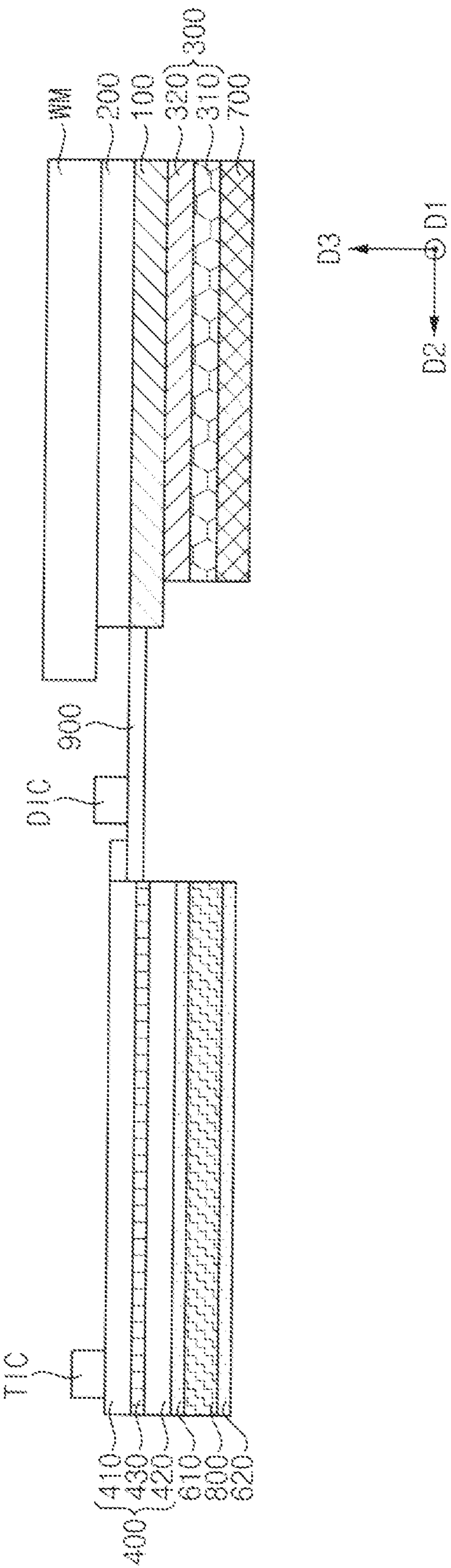
FIG. 32 is a schematic cross-sectional view illustrating the display device of FIG. 31.
Figure 33:
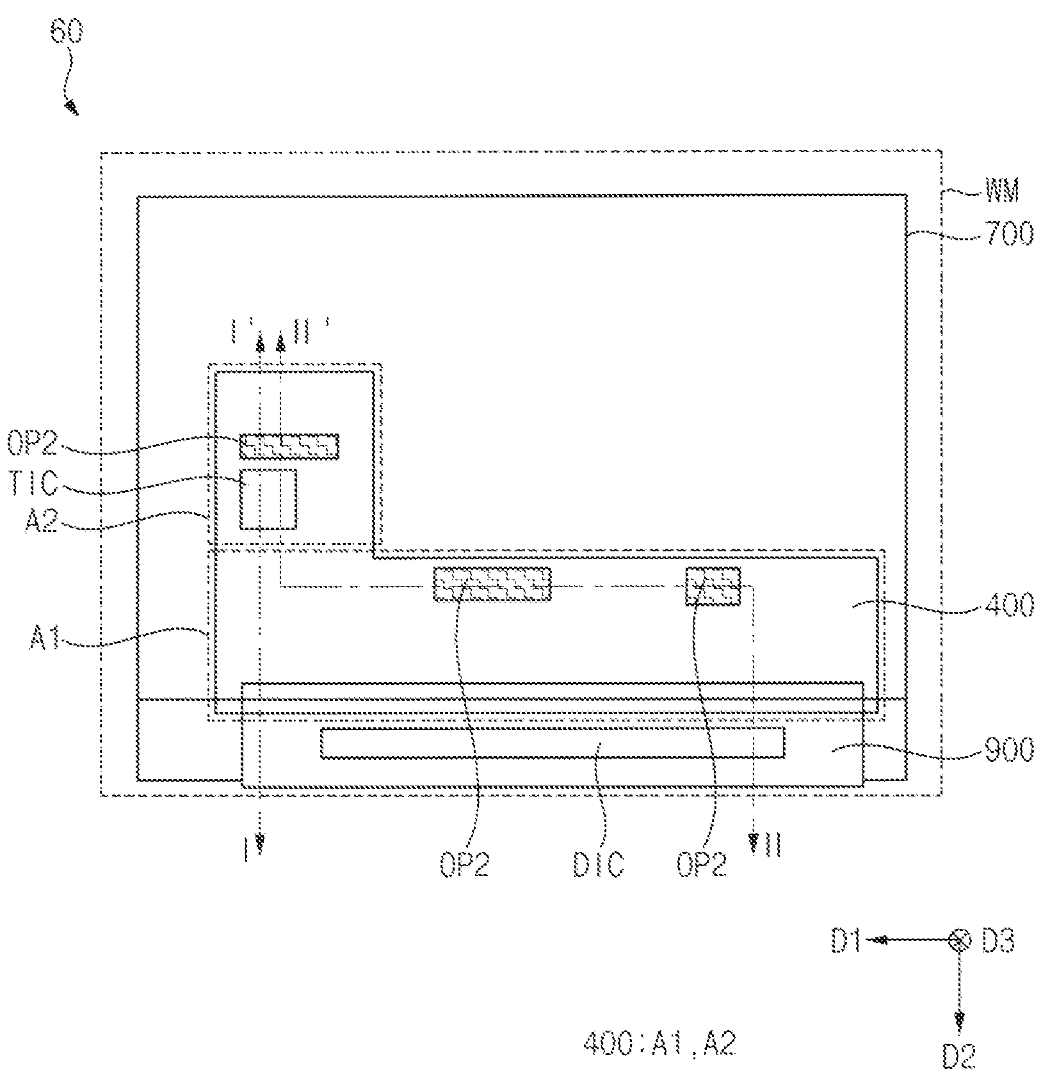
FIG. 33 is a schematic rear view illustrating the display device of FIG. 31.
Figure 34:
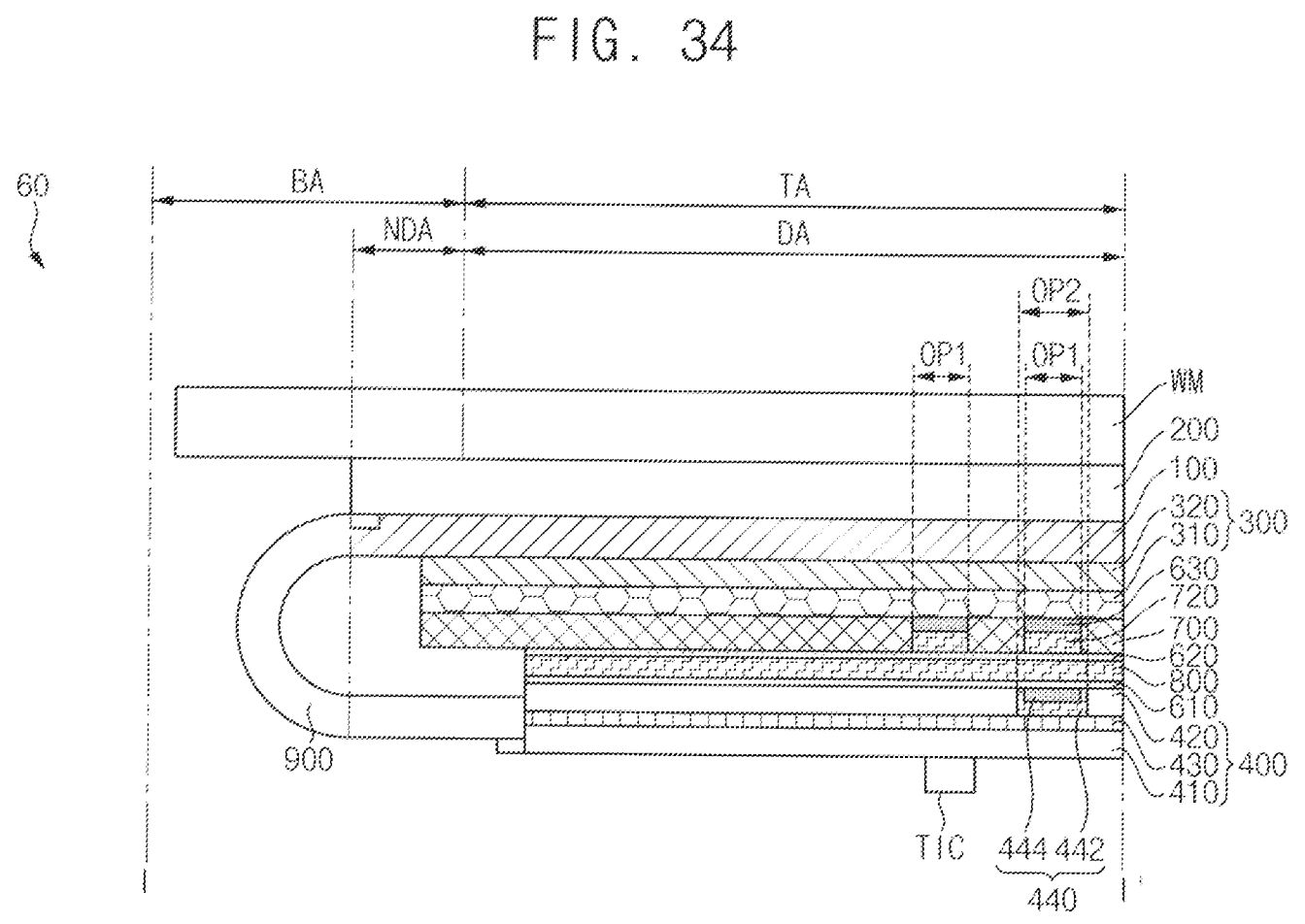
Figure 35:
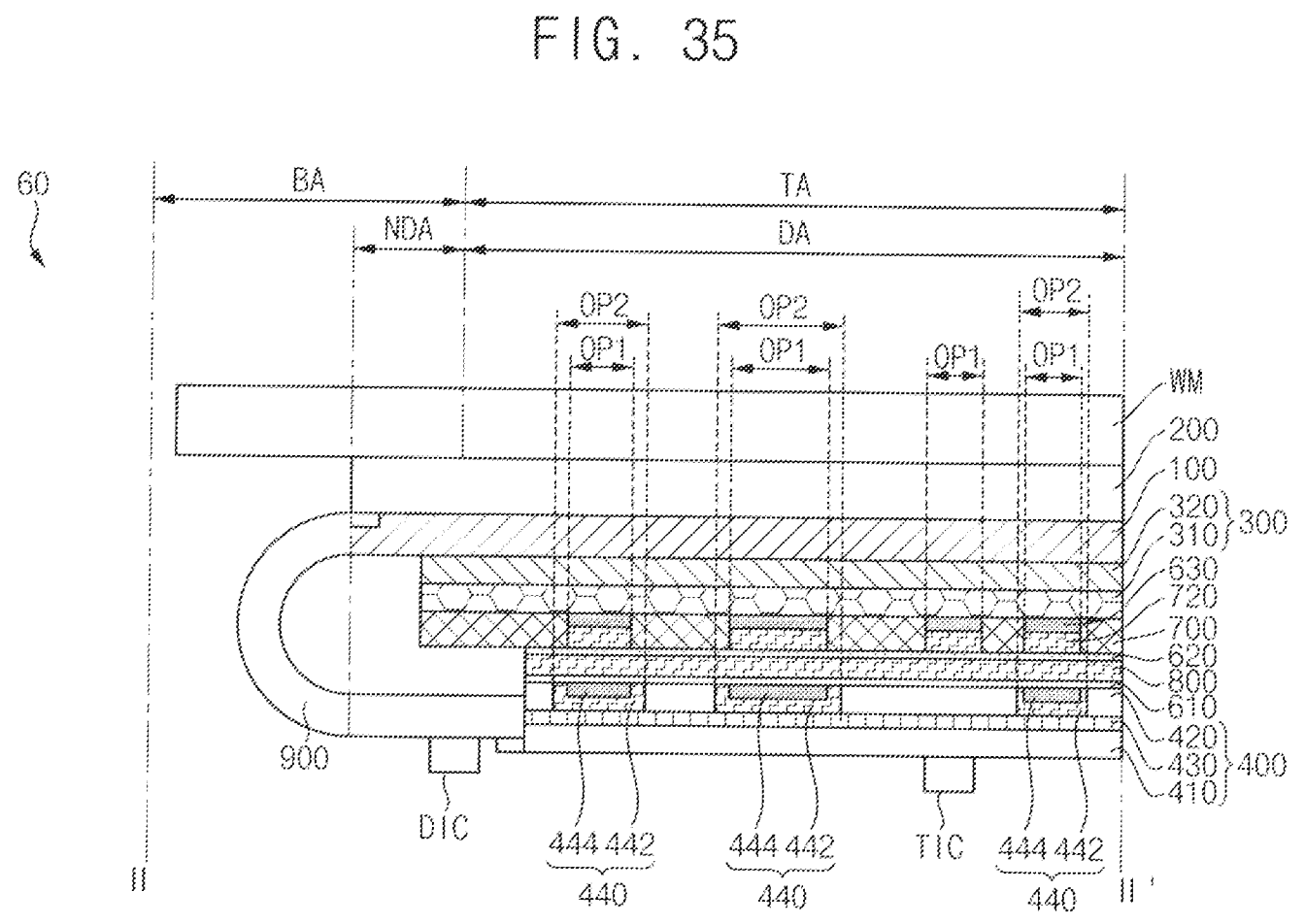

FIG. 31 is a schematic exploded perspective view illustrating a display device according to another embodiment. FIG. 32 is a schematic cross-sectional view illustrating the display device of FIG. 31. FIG. 33 is a schematic rear view illustrating the display device of FIG. 31. FIG. 34 is a schematic cross-sectional view taken along line I-I' of FIG. 33. FIG. 35 is a schematic cross-sectional view taken along line II-II' of FIG. 33.

An embodiment of a display device 60 shown in FIGS. 31 to 35 may be different from the embodiment of the display device 30 described above with reference to FIGS. 14 to 19 at least in a flexible circuit film 900.

In an embodiment, the flexible circuit film 900 of the display device 60 may be substantially same as described above in a description of the display device 40. A heat dissipation layer 700 may be disposed under a support member 300, and a second metal sheet 800 may be bonded to a second cover layer 420 of a circuit board 400 electrically connected to a display panel 100. Accordingly, as the display panel 100 unfolded as shown in FIG. 32 is bent as shown in FIGS. 33 to 35, the circuit board 400 electrically connected to the display panel 100 may be disposed under the display panel 100. A second metal sheet 800 bonded to the circuit board 400 may be bonded to the heat dissipation layer 700.

Any repetitive detailed description about a connection relationship between the circuit board 400, the heat dissipation layer 700, the first metal sheet 720, the second metal sheet 800, and the support member 300 described with reference to FIGS. 14 to 19 will be omitted.

According to embodiments, since the display device includes the metal sheet disposed between the circuit board 400 and the support member 300, the separate conductive layer may not be required. Accordingly, the stacked structure under the display panel 100 may be simplified and the stacked thickness may be kept thin. Accordingly, the change in resistance may be minimized, and the low resistance may be stably maintained. The heat dissipation characteristic of the display device may be further improved because of the excellent heat dissipation property of the metal sheet and the heat dissipation layer 700.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
- a display panel;
- a support member disposed under the display panel;
- a circuit board electrically connected to the display panel and disposed under the support member; and
- a metal sheet disposed between the circuit board and the support member, bonded to the circuit board by a first electrically conductive adhesive film, and bonded to the support member by a second electrically conductive adhesive film,
- wherein the metal sheet, the first electrically conductive adhesive film, and the second electrically conductive adhesive film overlap the circuit board in a cross-sectional view when the display device is in a flat configuration, and
- wherein the metal sheet is directly electrically connected to both the circuit board and the support member by the first and second electrically conductive adhesive films, respectively.

2. The display device of claim 1, wherein
- the circuit board includes:
  - a ground wire electrically connected to the metal sheet; and
  - a cover layer disposed between the metal sheet and the ground wire and including an opening which exposes a portion of the ground wire, and
- the metal sheet is bonded to the cover layer by the first electrically conductive adhesive film.

3. The display device of claim 2, wherein
- the circuit board further includes a step compensation film, and
- the step compensation film is disposed to correspond to the opening and electrically connects the metal sheet and the portion of the ground wire exposed by the opening.

4. The display device of claim 3, wherein the step compensation film includes:
- a conductive film; and
- a conductive tape disposed between the conductive film and the metal sheet.

5. The display device of claim 1, wherein each of the first electrically conductive adhesive film and the second electrically conductive adhesive film is a double-sided adhesive film.

6. The display device of claim 1, wherein each of the first electrically conductive adhesive film and the second electrically conductive adhesive film is an anisotropic conductive adhesive film.

7. The display device of claim 1, further comprising:
- a panel driving chip overlapping the support member, wherein
- the display panel includes:

a first area which emits light;
a second area extending from the first area and bent with a curvature; and
a third area extending from the second area and overlapping the support member, and
the panel driving chip is mounted on the third area of the display panel.

8. The display device of claim 1, further comprising:
a flexible circuit film electrically connecting the display panel and the circuit board and overlapping the support member; and
a panel driving chip mounted on the flexible circuit film and overlapping the support member.

* * * * *